(12) United States Patent
Wu

(10) Patent No.: US 12,317,470 B2
(45) Date of Patent: May 27, 2025

(54) SEMICONDUCTOR DEVICE, SEMICONDUCTOR STRUCTURE AND FORMATION METHOD THEREOF

(71) Applicant: CHANGXIN MEMORY TECHNOLOGIES, INC., Hefei (CN)

(72) Inventor: Ping-Heng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 615 days.

(21) Appl. No.: 17/452,614

(22) Filed: Oct. 28, 2021

(65) Prior Publication Data

US 2022/0122987 A1 Apr. 21, 2022

Related U.S. Application Data

(63) Continuation of application No. PCT/CN2021/106693, filed on Jul. 6, 2021.

(51) Int. Cl.
*H10B 12/00* (2023.01)

(52) U.S. Cl.
CPC ........... *H10B 12/038* (2023.02); *H10B 12/37* (2023.02); *H10B 12/482* (2023.02)

(58) Field of Classification Search
CPC .... H10B 12/482; H10B 12/37; H10B 12/038; H10B 12/0335; H10B 12/03; H10B 12/30; H10B 12/48; H10B 12/485
See application file for complete search history.

(56) References Cited

U.S. PATENT DOCUMENTS

| | | | |
|---|---|---|---|
| 2004/0000717 A1* | 1/2004 | Shin | H01L 21/76877 257/E21.585 |
| 2005/0020024 A1* | 1/2005 | Goldbach | H10B 12/37 438/386 |
| 2011/0121377 A1 | 5/2011 | Jin | |

(Continued)

FOREIGN PATENT DOCUMENTS

| | | |
|---|---|---|
| CN | 102969317 A | 3/2013 |
| CN | 103165538 A | 6/2013 |

(Continued)

OTHER PUBLICATIONS

International Search Report cited in PCT/CN2021/106693, mailed Oct. 14, 2021, 8 pages.

*Primary Examiner* — Tucker J Wright
*Assistant Examiner* — David W Ward
(74) *Attorney, Agent, or Firm* — Kilpatrick Townsend & Stockton LLP

(57) ABSTRACT

The present disclosure provides a semiconductor device, a semiconductor structure and a formation method thereof, and relates to the field of semiconductor technologies. The formation method includes: providing a substrate, and forming a sacrificial layer on the substrate; patterning the sacrificial layer to form trenches and through holes distributed side by side in the sacrificial layer; forming insulating layers covering a sidewall of the trench and a sidewall of the through hole; sequentially forming a conductive layer and a passivation layer in the trench and the through hole to form a bitline structure in the trench; and removing the passivation layer in the through hole to form a capacitor contact structure in the through hole.

7 Claims, 22 Drawing Sheets

(56) References Cited

U.S. PATENT DOCUMENTS

| | | | | |
|---|---|---|---|---|
| 2014/0001527 A1* | 1/2014 | Myung | ................ | H01L 27/105 |
| | | | | 257/296 |
| 2015/0371946 A1* | 12/2015 | Segawa | ............. | H01L 21/76224 |
| | | | | 257/506 |
| 2016/0204059 A1* | 7/2016 | Fukuo | ............... | H01L 21/76834 |
| | | | | 257/773 |
| 2016/0351501 A1* | 12/2016 | Chun | ................ | H01L 21/76897 |
| 2020/0388618 A1* | 12/2020 | Ikeda | ................ | H10B 12/0335 |

FOREIGN PATENT DOCUMENTS

| | | | |
|---|---|---|---|
| CN | 103383935 | A | 11/2013 |
| CN | 103383935 | B | 10/2017 |
| CN | 109148376 | A | 1/2019 |
| CN | 109390285 | A | 2/2019 |
| TW | 200707654 | A | 2/2007 |
| TW | I328864 | B | 8/2010 |

* cited by examiner

SEMICONDUCTOR DEVICE, SEMICONDUCTOR STRUCTURE AND FORMATION METHOD THEREOF

CROSS-REFERENCE TO RELATED APPLICATIONS

This application is a continuation application of International Patent Application No. PCT/CN2021/106693, filed on Jul. 16, 2021, which claims priority to Chinese Patent Application No. 202011103875.6, filed with the Chinese Patent Office on Oct. 15, 2020 and entitled "SEMICONDUCTOR DEVICE, SEMICONDUCTOR STRUCTURE AND FORMATION METHOD THEREOF." International Patent Application No. PCT/CN2021/106693 and Chinese Patent Application No. 202011103875.6 are incorporated herein by reference in their entireties.

TECHNICAL FIELD

The present disclosure relates to the field of semiconductor technologies, and in particular, to a semiconductor device, a semiconductor structure and a formation method thereof.

BACKGROUND

A Dynamic Random Access Memory (DRAM) is widely used in mobile devices such as mobile phones, tablet computers, or the like, due to its advantages, such as a small size, high integration, a fast transmission speed, or the like.

An existing dynamic random access memory includes bitlines and capacitor contact windows arranged alternately with the bitlines. However, when the bitlines and the capacitor contact windows are formed, a structure anomaly is easy to occur and a device yield is low due to the influence of a manufacturing process.

It is to be noted that the information disclosed in the above background section is intended only to enhance the understanding of the background of the present disclosure and therefore can include information that does not form the prior art known to those of ordinary skill in the art.

SUMMARY

The present disclosure provides a semiconductor device, a semiconductor structure and a formation method thereof, which can prevent a structure anomaly and improve a device yield.

According to one aspect of the present disclosure, a semiconductor structure formation method is provided, including:
  providing a substrate, and forming a sacrificial layer on the substrate;
  patterning the sacrificial layer to form trenches and through holes distributed side by side in the sacrificial layer;
  forming insulating layers covering a sidewall of the trench and a sidewall of the through hole;
  sequentially forming a conductive layer and a passivation layer in the trench and the through hole to form a bitline structure in the trench; and
  removing the passivation layer in the through hole to form a capacitor contact structure in the through hole.

According to one aspect of the present disclosure, a semiconductor structure formation method is provided, including:
  providing a substrate, and forming a sacrificial layer on the substrate;
  patterning the sacrificial layer to form first sacrificial structures and second sacrificial structures distributed side by side;
  forming insulating layers covering a sidewall of the first sacrificial structure and a sidewall of the second sacrificial structure;
  removing the first sacrificial structure to form a trench, and removing the second sacrificial structure to form a through hole;
  sequentially forming a conductive layer and a passivation layer in the trench and the through hole to form a bitline structure in the trench; and
  removing the passivation layer in the through hole to form a capacitor contact structure.

According to one aspect of the present disclosure, a semiconductor structure is provided, wherein the semiconductor structure is formed with the semiconductor structure formation method described in any one of the above.

According to one aspect of the present disclosure, a semiconductor device is provided, wherein the semiconductor device includes the semiconductor structure described in any one of the above, and a capacitor in a contact connection with the capacitor contact structure.

It should be understood that the general description above and the detailed description in the following are merely exemplary and illustrative, and cannot limit the present disclosure.

BRIEF DESCRIPTION OF DRAWINGS

The accompanying drawings, which are incorporated herein and constitute a part of this specification, illustrate embodiments consistent with the present disclosure and, together with the specification, serve to explain principles of the present disclosure. Obviously, the accompanying drawings described below are merely some embodiments of the present disclosure. Those of ordinary skill in the art can also obtain other accompanying drawings according to the described accompanying drawings without creative efforts.

Figure 1:
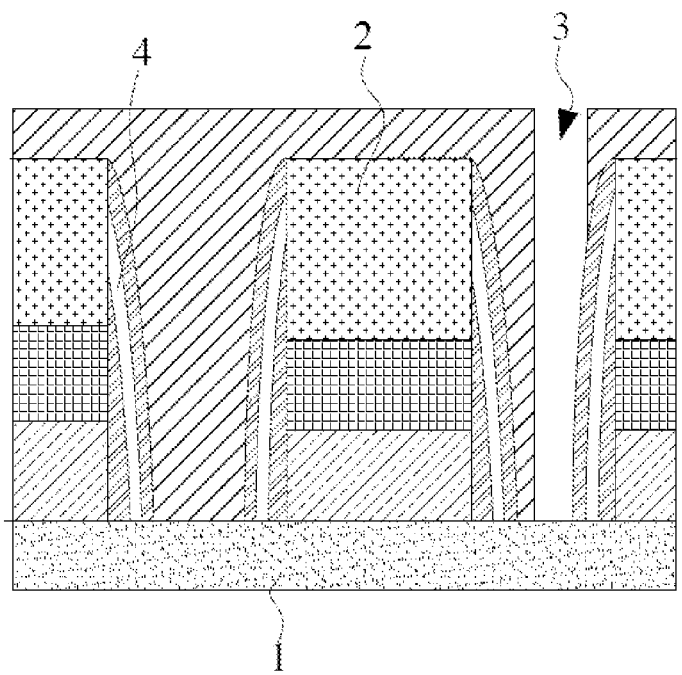
FIG. 1 is a schematic structural diagram of a semiconductor structure in the prior art.

In the drawings, 1: substrate; 2: bitline structure; 3: capacitor contact structure; 4: air gap structure; 100: substrate; 101: bitline formation region; 102: capacitor contact structure formation region; 200: sacrificial layer; 201: trench; 202: through hole; 211: first gap; 212: second gap; 300: insulating layer; 410: bitline structure; 401: first conductive layer; 402: second conductive layer; 403: passivation layer; 420: capacitor contact structure; 500: dielectric layer; 600: substrate; 601: bitline formation region; 602: capacitor contact structure formation region; 700: sacrificial layer; 701: trench; 702: through hole; 710: first sacrificial structure; 720: second sacrificial structure; 731: first gap; 740: filling layer; 750: dielectric layer; 800: insulating layer; 910: bitline structure; 901: first conductive layer; 902: second conductive layer; 903: passivation layer; 920: capacitor contact structure.

DESCRIPTION OF EMBODIMENTS

Exemplary implementations are now described more comprehensively with reference to the accompanying drawings. However, the exemplary implementations may be implemented in various forms, and are not understood as being limited to the implementations described herein. Conversely, the exemplary implementations are provided to make the descriptions of the present disclosure more comprehensive and complete, and to completely convey the idea of the exemplary implementations to those skilled in the art. Identical reference numerals in the drawings represent identical or similar structures, and therefore, detailed descriptions thereof are omitted.

Relative terms, such as "upper" or "lower", as used in this specification, are directed to describe a relative relationship between one component and another component illustrated in the drawings, but these terms are used in this specification for convenience only, for example, according to the direction of the examples as shown in the drawings. It should be appreciated that if a device in the drawings is flipped upside down, the component indicated as being "upper" would become the component being "lower". When a structure is "on" another structure, it is possible to indicate that the structure is integrally formed on the another structure, or the structure is "directly" arranged on the another structure, or the structure is "indirectly" formed on the another structure through a further structure.

The terms "one", "a/an", "the" and "said" are intended to express the presence of one or more elements/components/or the like. The terms "include/comprise" and "have" are intended to be an open inclusion, and mean there may be additional elements/components/or the like other than the listed elements/components/or the like. The terms "first", "second", and "third" are meant to indication, but not to limit numbers of objects to which they modify.

In a related art, as shown in FIG. 1, a semiconductor device mainly includes a plurality of bitline structures 2 and capacitor contact windows 3 configured to form capacitor contact structures that are alternately distributed and formed on a substrate 1. During the manufacturing, the bitline structures 2 are required to be formed on the substrate 1 first and then a capacitor contact structure is formed between two adjacent bitline structures 2. In addition, in order to reduce parasitic capacitance of the device, an air gap structure 4 is generally formed on a sidewall of each bitline structure 2. However, the design of the air gap structure 4 weakens protection strength between the bitline structure 2 and the capacitor contact structure. Moreover, since the bitline structure 2 and the capacitor contact structure are formed in different periods, exposure deviation between layers is easy to occur, so that the capacitor contact structure is prone to misalignment, which easily causes damages to the air gap structure 4 when the capacitor contact window 3 is formed, thereby leading to a structure anomaly and a low device yield.

Figure 2:
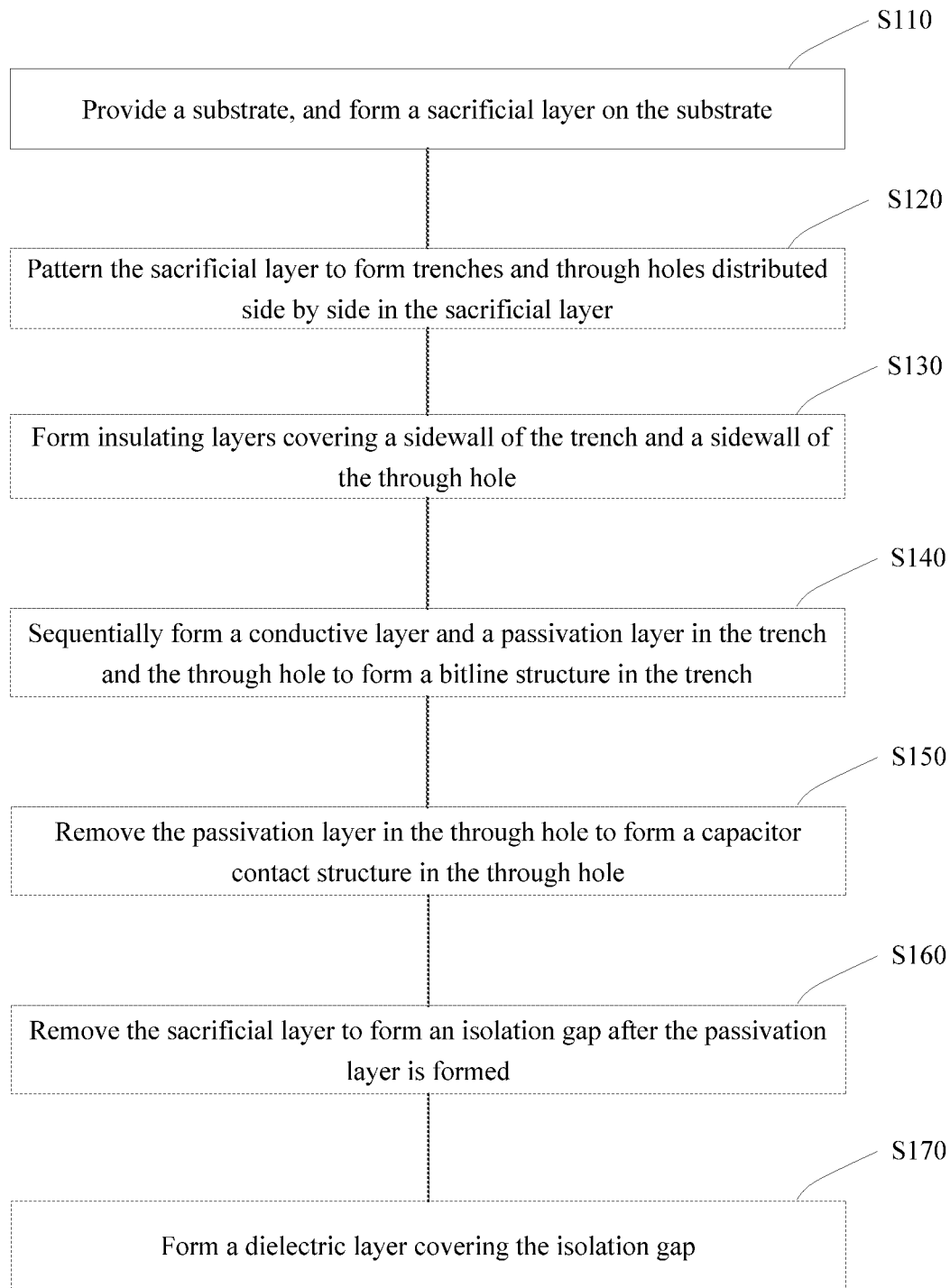
FIG. 2 is a flowchart of a semiconductor structure formation method according to a first implementation of the present disclosure.

A first implementation of the present disclosure provides a semiconductor structure formation method. As shown in FIG. 2, the formation method may include the following steps.

In step S110, a substrate is provided, and a sacrificial layer is formed on the substrate.

In step S120, the sacrificial layer is patterned to form trenches and through holes distributed side by side in the sacrificial layer.

In step S130, insulating layers covering a sidewall of the trench and a sidewall of the through hole are formed.

In step S140, a conductive layer and a passivation layer are sequentially formed in the trench and the through hole to form a bitline structure in the trench.

In step S150, the passivation layer in the through hole is removed to form a capacitor contact structure in the through hole.

Figure 3:
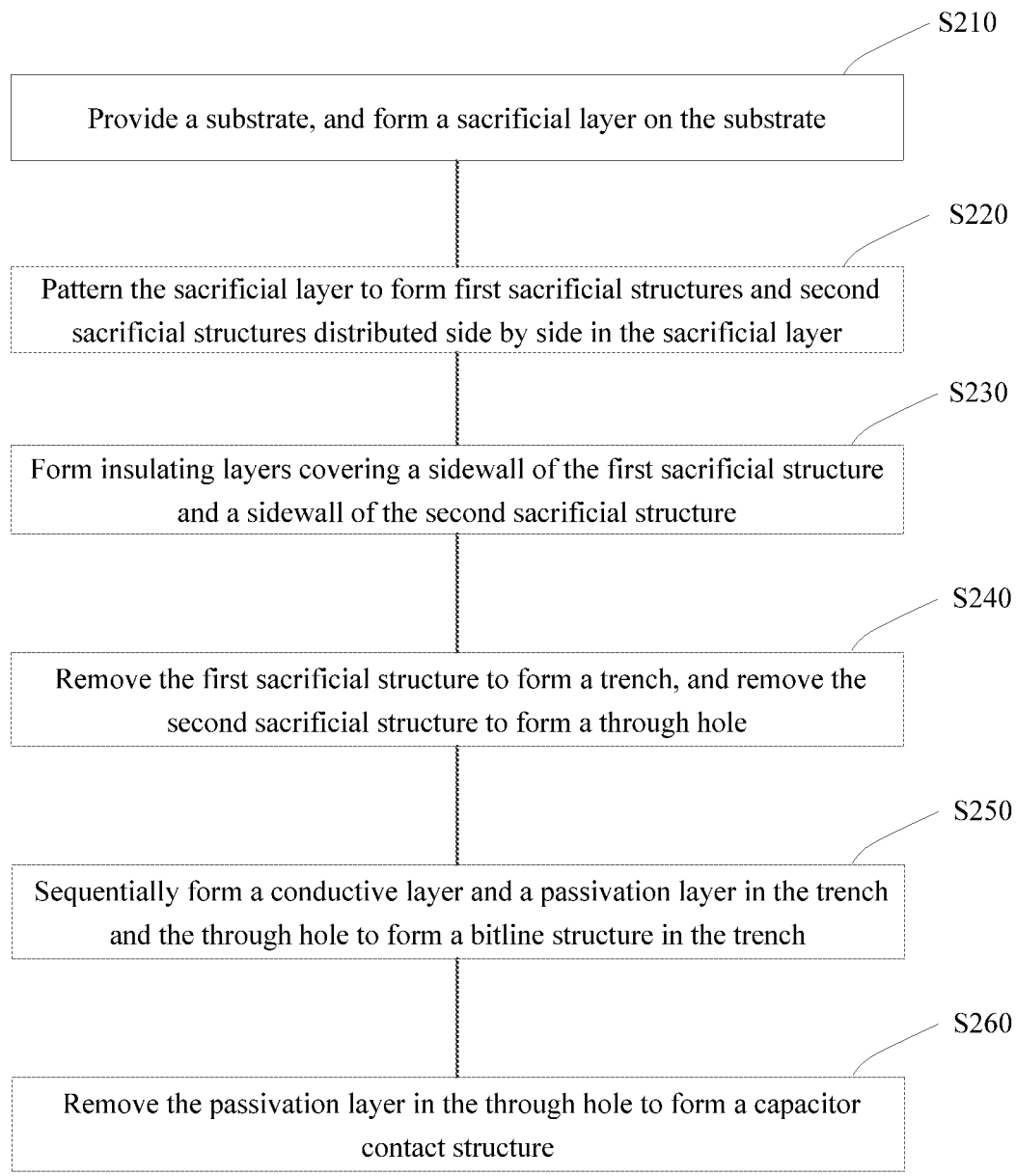
FIG. 3 is a flowchart of the semiconductor structure formation method according to a second implementation of the present disclosure.

A second implementation of the present disclosure provides a semiconductor structure formation method. As shown in FIG. 3, the formation method may include the following steps.

In step S210, a substrate is provided, and a sacrificial layer is formed on the substrate.

In step S220, the sacrificial layer is patterned to form first sacrificial structures and second sacrificial structures distributed side by side.

In step S230, insulating layers covering a sidewall of the first sacrificial structure and a sidewall of the second sacrificial structure are formed.

In step S240, the first sacrificial structure is removed to form a trench, and the second sacrificial structure is removed to form a through hole.

In step S250, a conductive layer and a passivation layer are sequentially formed in the trench and the through hole to form a bitline structure in the trench.

In step S260, the passivation layer in the through hole is removed to form a capacitor contact structure.

In the semiconductor device, the semiconductor structure and the formation method thereof according to the embodiments of the present disclosure, two sides of the bitline structure and the capacitor contact structure can be insulated through the insulating layers to prevent the contact of the bitline structure and the capacitor contact structure with other structures and reduce a risk of short circuit. In addition, the capacitor contact structure and the bitline structure may be formed simultaneously using a same manufacturing process, so as to prevent the misalignment of the capacitor contact structure caused by separate manufacturing of the capacitor contact structure and the bitline structure. Moreover, during the manufacturing, the bitline structure is formed in the trench, and the capacitor contact structure is formed in the through hole; that is, their positions are predefined; therefore, the capacitor contact structure formed may not deviate, thereby preventing the structure anomaly and improving the device yield.

Each step in the semiconductor structure formation method according to the first implementation of the present disclosure is described in detail below.

As shown in FIG. 2, in step S110, a substrate is provided, and a sacrificial layer is formed on the substrate.

Figure 4:
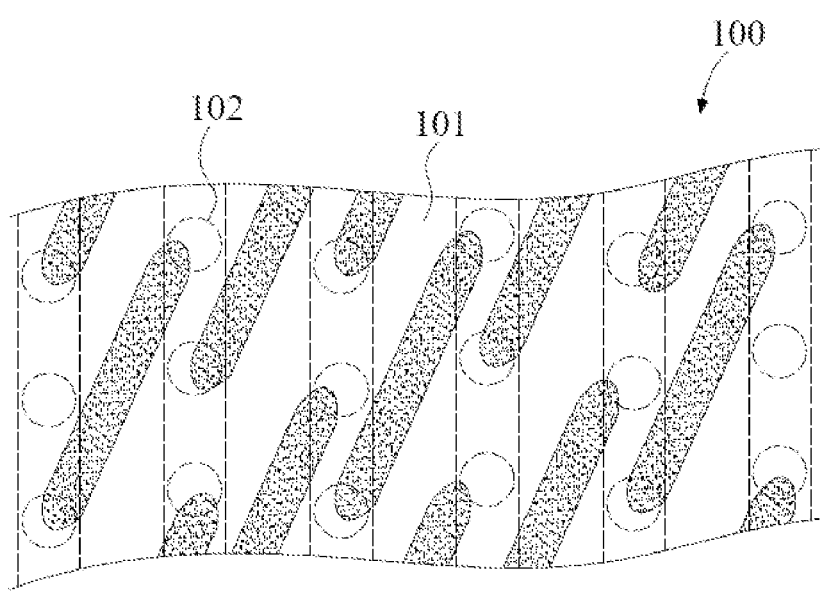
FIG. 4 is a top view of a substrate according to the first implementation of the present disclosure.
Figure 5:
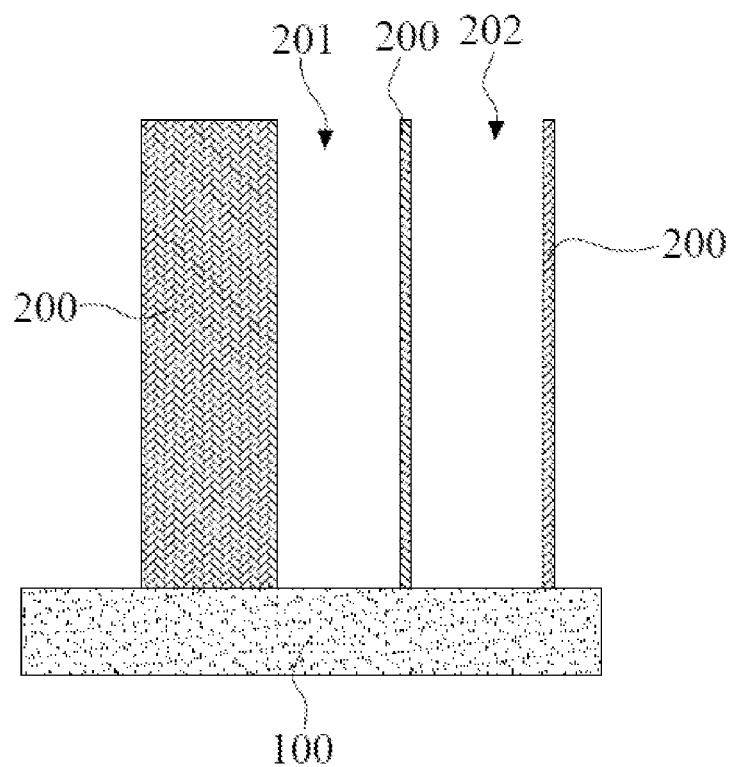
FIG. 5 is a schematic diagram corresponding to a structure after completion of step S120 in FIG. 2.

As shown in FIG. 4 and FIG. 5, the substrate 100 may be of a plate structure, and a bitline formation region 101 and a formation region 102 of capacitor contact structures 420 may be predefined on the substrate 100. The substrate 100 may be a rectangular, circular, oval, polygonal or irregular pattern, and may be made of silicon or other semiconductor materials. The shape and material of the substrate 100 are not specially limited.

A sacrificial layer 200 may be formed on a surface of the substrate 100. The sacrificial layer 200 may be a film formed on the substrate 100 or a coating formed on substrate 100. For example, it may be a photoresist or a hard mask and may be made of silicon oxide, or the like, which are not specially limited herein. A thickness of the sacrificial layer 200 may be the same as that of the required bitline structure. In one implementation, the thickness may range from 50 nm to 200 nm. For example, the thickness may be 50 nm, 100 nm, 150 nm or 200 nm, and certainly, may also be other values, which are not listed herein. The sacrificial layer 200 may be formed on the substrate 100 by atomic layer deposition, vacuum evaporation, magnetron sputtering, chemical vapor deposition, physical vapor deposition, or the like. Certainly, the sacrificial layer 200 may also be formed on the substrate 100 by using other processes, and a forming process of the sacrificial layer 200 is not specially limited herein.

As shown in FIG. 2, in step S120, the sacrificial layer is patterned to form trenches and through holes distributed side by side in the sacrificial layer.

Figure 6:
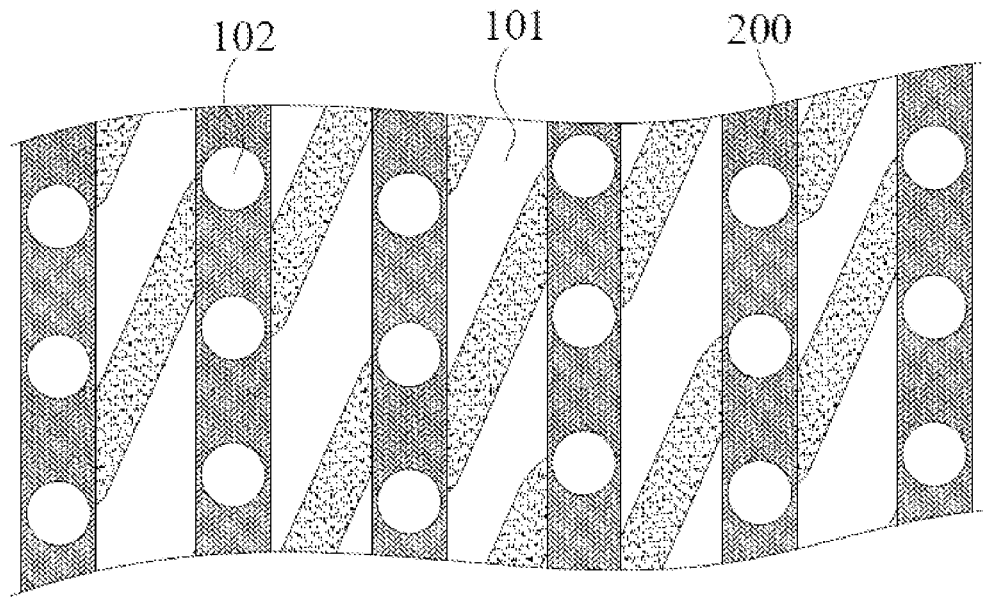
FIG. 6 is a top view corresponding to the structure in FIG. 5.

As shown in FIG. 5 and FIG. 6, the sacrificial layer 200 may be patterned by photolithography according to the predefined bitline formation region 101 and formation region 102 of capacitor contact structures 420, so as to form trenches 201 and through holes 202 distributed side by side in the sacrificial layer 200. The trench 201 may be connected at two ends in a direction perpendicular to the substrate 100, may be strip-like in a direction parallel to the substrate 100, and may extend along the direction parallel to the substrate 100. The through hole 202 may be a circular hole, rectangular hole or irregular hole structure, which is not specially limited herein.

A plurality of through holes 202 may be provided. The plurality of through holes 202 may be arranged in a row and spaced along an extension direction of the trench 201. In one implementation, each trench 201 may form a group with each column of through holes 202, a plurality of groups of trenches 201 and through holes 202 distributed side by side may be formed, and columns formed by the trenches 201 and the through holes 202 in two adjacent groups are alternately distributed. That is, the through holes 202 are distributed on two sides of the trench 201 and may be spaced along an extension direction of the trench.

For example, a mask material layer may be formed on one side of the sacrificial layer 200 away from the substrate 100 by chemical vapor deposition, vacuum evaporation, atomic layer deposition or other means. The mask material layer may be of a multi-layer or monolayer structure, and may be made of at least one of a polymer, SiO2, SiN, poly and SiCN, and certainly, may also be made of other materials, which are not listed herein.

A photoresist layer may be formed on a surface of the mask material layer facing away from the sacrificial layer 200 by spin coating or other means. The photoresist layer may be made of a positive photoresist or a negative photoresist, which is not specially limited herein.

The photoresist layer may be exposed by using a photomask. A pattern of the photomask may match a pattern required by the sacrificial layer 200. Then, the exposed photoresist layer may be developed to form a plurality of development regions. The mask material layer may be exposed from each development region, and a pattern of the development region may be the same as the pattern required by the sacrificial layer 200. A size of each development region may match required sizes of the trench 201 and the through hole 202.

The mask material layer may be etched in the development region by using a plasma etching process. The sacrificial layer 200 may be exposed from an etch region, so as to form a required mask pattern on the mask material layer. After completion of the etching process, the photoresist layer may be removed by cleaning with a cleaning solution or by a process such as ashing, or the like, so that the mask material layer is no longer covered with the photoresist layer, and a formed mask layer is exposed to obtain a hard mask structure.

The sacrificial layer 200 may be isotropically etched according to the mask pattern. For example, the sacrificial layer 200 may be etched in the development region of the mask pattern by a dry etching process, the substrate 100 is used as an etch stop layer, and the trenches 201 and the through holes 202 distributed side by side are formed in the sacrificial layer 200. FIG. 5 shows a structure after completion of step S120 in the first implementation of the formation method according to the present disclosure.

As shown in FIG. 2, in step S130, insulating layers covering a sidewall of the trench and a sidewall of the through hole are formed.

Figure 7:
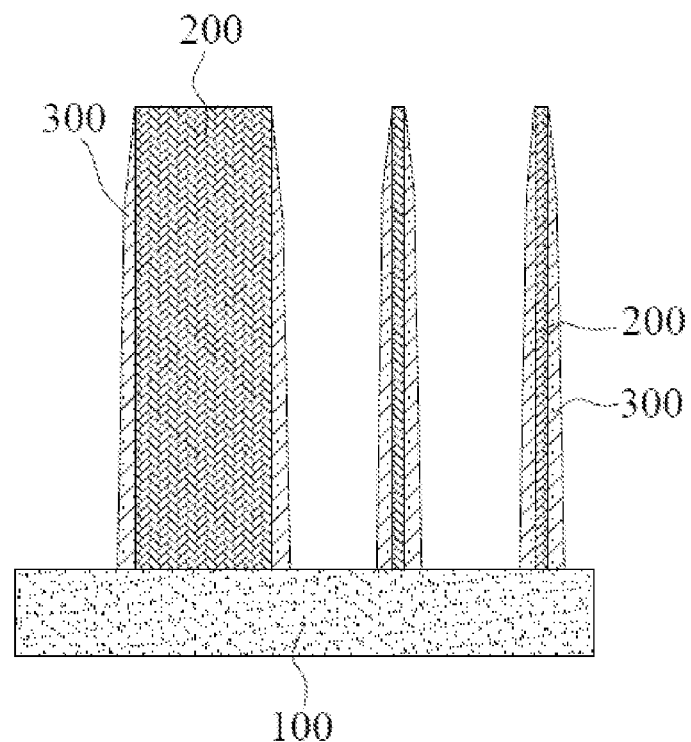
FIG. 7 is a schematic diagram corresponding to a structure after completion of step S130 in FIG. 2.
Figure 8:
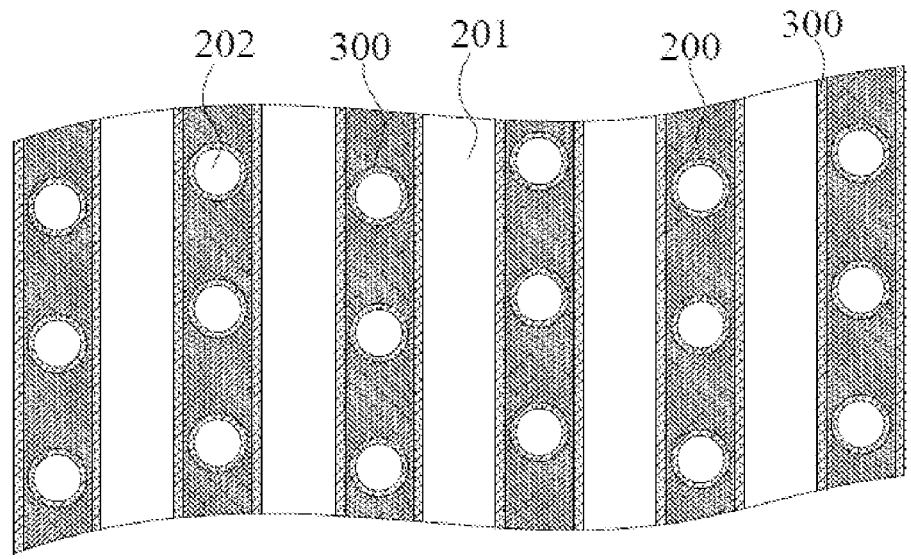
FIG. 8 is a top view corresponding to the structure in FIG. 7.

As shown in FIG. 7 and FIG. 8, conformal insulating layers 300 may be formed on a sidewall of the through hole 202 and a sidewall of the trench 201, and the insulating layer 300 located on two sidewalls of the trench 201 may be spread over the two sidewalls of the trench 201. When the trench 201 is strip-like, the insulating layer 300 located on the two sidewalls of the trench 201 may be arranged oppositely. The insulating layer 300 located on the sidewall of the through hole 202 may be spread over hole walls of the through hole 202. That is, when the through hole 202 is a circular hole, the insulating layer 300 located on the sidewall of the through hole 202 may have a circular cross section in the direction parallel to the substrate 100; when the through hole 202 is a rectangular hole, the insulating layer 300 located on the sidewall of the through hole 202 may have a rectangular cross section in the direction parallel to the substrate 100. A thickness of the insulating layer 300 may range from 1 nm to 5 nm, and certainly, may also be in other ranges, which is not specially limited herein.

It is to be noted that the insulating layer 300 located on the sidewall of the trench 201 may be separated from the insulating layer 300 located on the sidewall of the through hole 202 through the sacrificial layer 200. One side of the insulating layer 300 close to the substrate 100 may be in a contact connection with the substrate 100, and one side thereof facing away from the substrate 100 may be flush with the surface of the sacrificial layer 200 facing away from the substrate 100.

The insulating layer 300 may be a film formed on the sidewall of the through hole 202 and the sidewall of the trench 201 or a film layer formed on the sidewall of the through hole 202 and the sidewall of the trench 201, which is not specially limited herein. The insulating layer 300 may be formed on the sidewall of the through hole 202 and the sidewall of the trench 201 by using a chemical vapor deposition process, and certainly, the insulating layer 300 may also be formed by using other processes, which is not specially limited herein.

It is to be noted that an etching ratio of a material of the sacrificial layer 200 to a material of the insulating layer 300 may be high. For example, the etching ratio of the material of the sacrificial layer 200 to the material of the insulating layer 300 may be greater than 100:1. For example, the insulating layer 300 may be made of Si3N4 or SiCN, and certainly, may also be made of other insulating materials, which are not listed one by one herein.

As shown in FIG. 2, in step S140, a conductive layer and a passivation layer are sequentially formed in the trench and the through hole to form a bitline structure in the trench.

Figure 9:
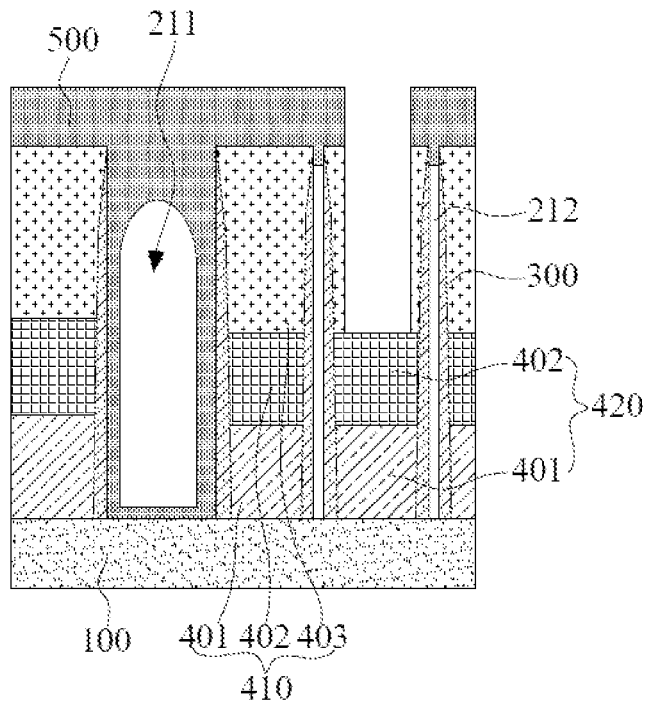
FIG. 9 is a schematic diagram of a semiconductor structure according to the first implementation of the present disclosure.

As shown in FIG. 8 and FIG. 9, a bitline structure 410 may be formed in the trench 201, the capacitor contact structure 420 is formed in the through hole 202 at the same time, and then the bitline structure 410 may be in a contact connection with a source or drain in the substrate 100 and the capacitor contact structure 420 may be in a contact connection with a capacitor, so as to store charges collected by the capacitor through the capacitor contact structure 420.

It is to be noted that, when a plurality of through holes 202 are provided, the capacitor contact structure 420 may be formed in each through hole 202. Each capacitor contact structure 420 may have a capacitor corresponding thereto. The charges may be stored simultaneously through a plurality of capacitor contact structures 420, to improve storage capability of a DRAM. When a plurality of trenches 201 are provided, the bitline structure 410 may be formed in each trench 201.

The conductive layer may be of a monolayer or multilayer structure, and may be made of a conductor or semiconductor material, which may be, for example, polysilicon, silicon-germanium (SiGe), tungsten, titanium, cobalt, or the like, or compositions thereof, and certainly, may also be other conductive materials. For example, it may also be a metal silicide and compositions of different metal silicides. A number of film layers and the material of the conductive layer are not specially limited herein.

The conductive layer and the passivation layer 403 may be sequentially formed in the trench 201 and the through hole 202 by atomic layer deposition, vacuum evaporation, magnetron sputtering, chemical vapor deposition, physical vapor deposition, or the like. Certainly, the conductive layer and the passivation layer 403 may also be formed in other manners, which are not listed one by one herein.

Figure 10:
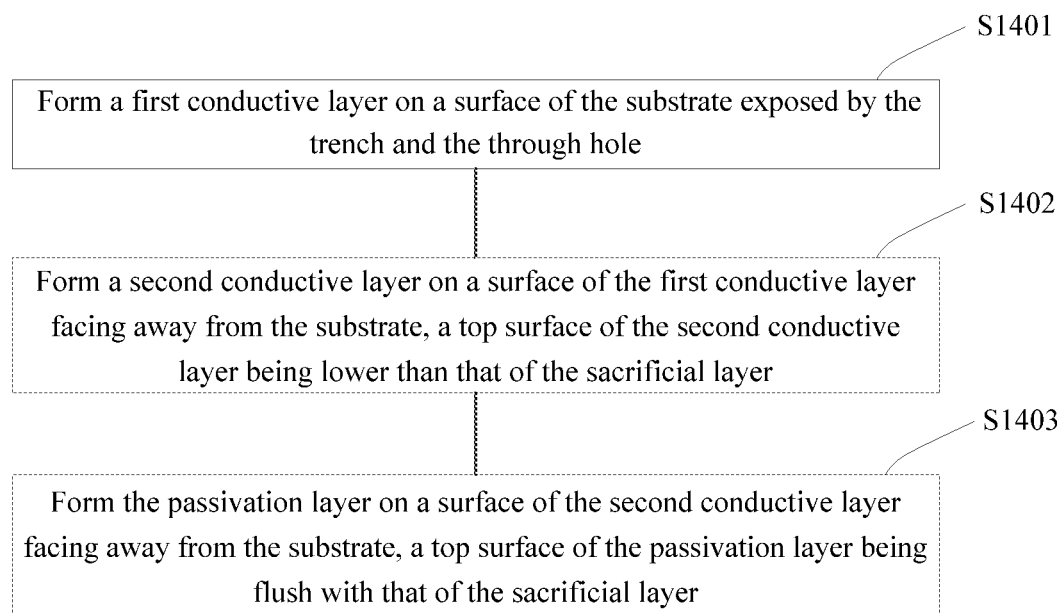
FIG. 10 is a flowchart corresponding to step S140 in FIG. 2.

In one implementation, as shown in FIG. 10, the step of sequentially forming a conductive layer and a passivation layer 403 in the trench 201 and the through hole 202 may include steps S1401 to S1403.

In step S1401, a first conductive layer is formed on a surface of the substrate exposed by the trench and the through hole.

Figure 11:
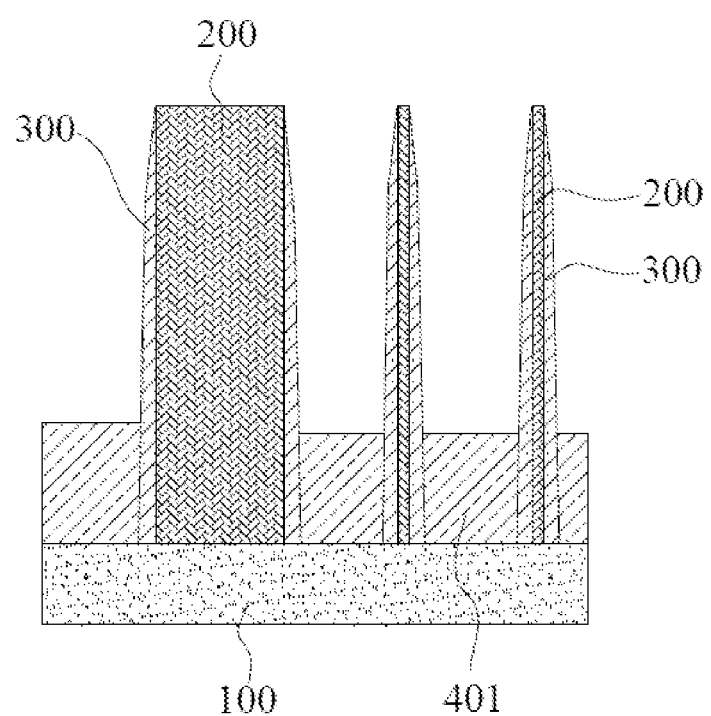
FIG. 11 is a schematic diagram corresponding to a structure after completion of step S1401 in FIG. 10.

As shown in FIG. 11, the first conductive layer 401 may be a film formed on the surface of the substrate 100 and may be made of polysilicon. The first conductive layer 401 may be simultaneously formed, by atomic layer deposition, on the surface of the substrate 100 exposed by the trench 201 and the through hole 202. The first conductive layer 401 may be in a contact connection with the substrate 100, and a surface thereof facing away from the substrate 100 may be lower than one end of the insulating layer 300 facing away from the substrate 100.

In step S1402, a second conductive layer is formed on a surface of the first conductive layer facing away from the substrate, a top surface of the second conductive layer being lower than that of the sacrificial layer.

Figure 12:
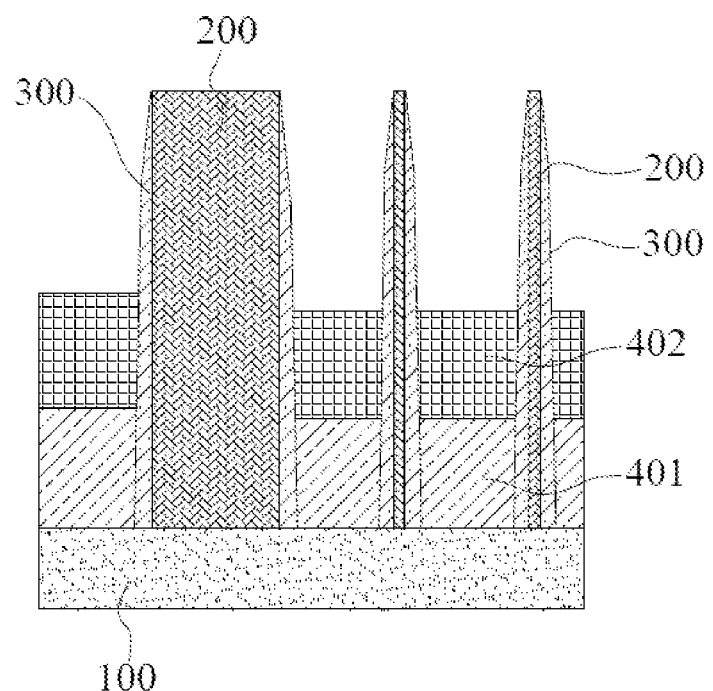
FIG. 12 is a schematic structural diagram corresponding to the completion of step S1402 in FIG. 10.

As shown in FIG. 12, the second conductive layer 402 may be a film formed on one side of the first conductive layer 401 facing away from the substrate 100 and may be made of tungsten. The second conductive layer 402 may be simultaneously formed, by vacuum evaporation or magnetron sputtering, on the side of the first conductive layer 401 facing away from the substrate 100. The second conductive layer 402 may be in a contact connection with the first conductive layer 401, and a surface thereof facing away from the first conductive layer 401 may be lower than the end of the insulating layer 300 facing away from the substrate 100.

In step S1403, the passivation layer is formed on a surface of the second conductive layer facing away from the substrate, a top surface of the passivation layer being flush with that of the sacrificial layer 200.

Figure 13:
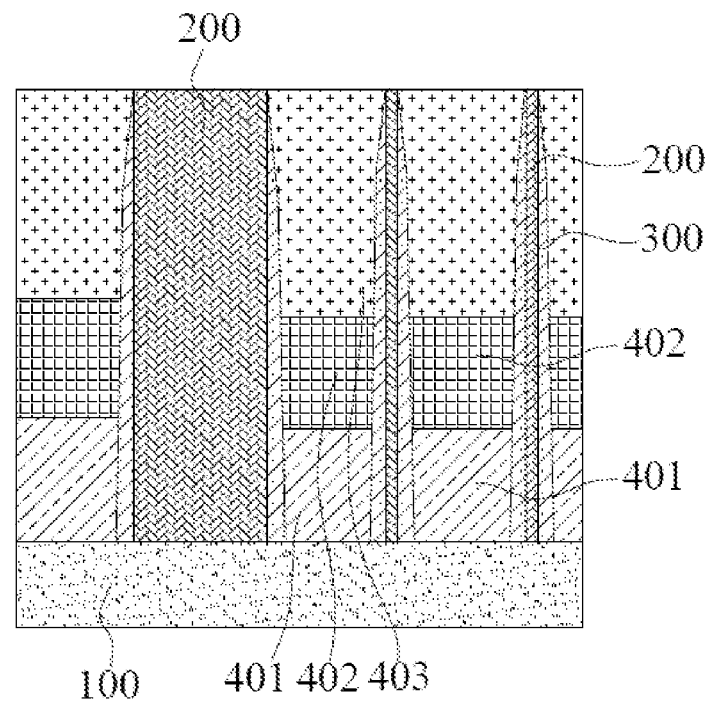
FIG. 13 is a schematic diagram corresponding to a structure after completion of step S1403 in FIG. 10.
Figure 14:
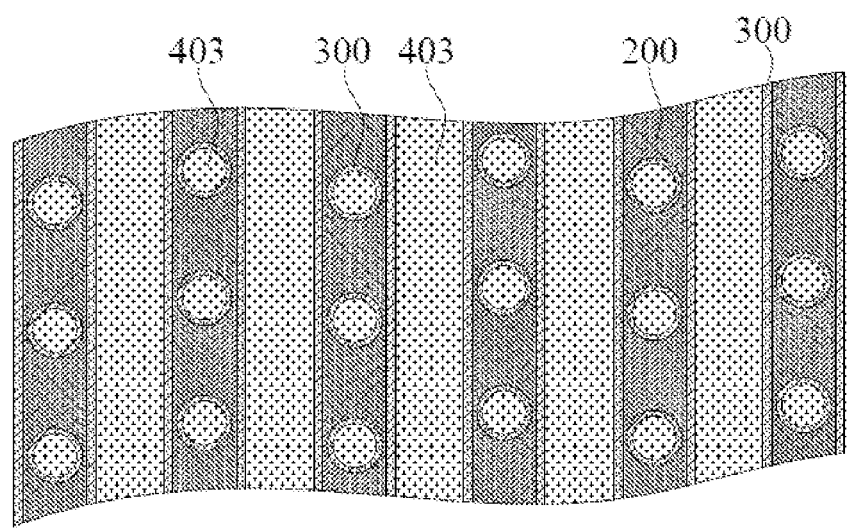
FIG. 14 is a top view corresponding to a structure after completion of step S1403 in FIG. 10.

As shown in FIG. 13 and FIG. 14, the passivation layer 403 may be a film formed on one side of the second conductive layer 402 facing away from the first conductive layer 401, may be configured to protect a surface of the conductive layer, and may be made of silicon nitride. In order to facilitate the process, the passivation layer 403 may be simultaneously formed, by chemical vapor deposition or physical vapor deposition, on the side of the second conductive layer 402 facing away from the first conductive layer 401, and then the bitline structure 410 may be formed in the trench 201. It is to be noted that a surface of the passivation layer 403 facing away from the second conductive layer 402 may be flush with the top surface of the sacrificial layer 200.

As shown in FIG. 2, in step S150, the passivation layer in the through hole is removed to form a capacitor contact structure in the through hole.

As shown in FIG. 9, the passivation layer 403 located in the through hole 202 may be removed to form the capacitor contact structure 420 in the through hole 202; that is, the capacitor contact structure 420 may include a conductive layer formed on the substrate 100. For example, the passivation layer 403 located in the through hole 202 may be removed by an anisotropic etching process, to form the capacitor contact structure 420 in each through hole 202.

In one implementation of the present disclosure, the formation method according to the present disclosure may further include steps S160 and S170, as shown in FIG. 2.

In step S160, the sacrificial layer is removed to form an isolation gap after the passivation layer is formed.

Figure 15:
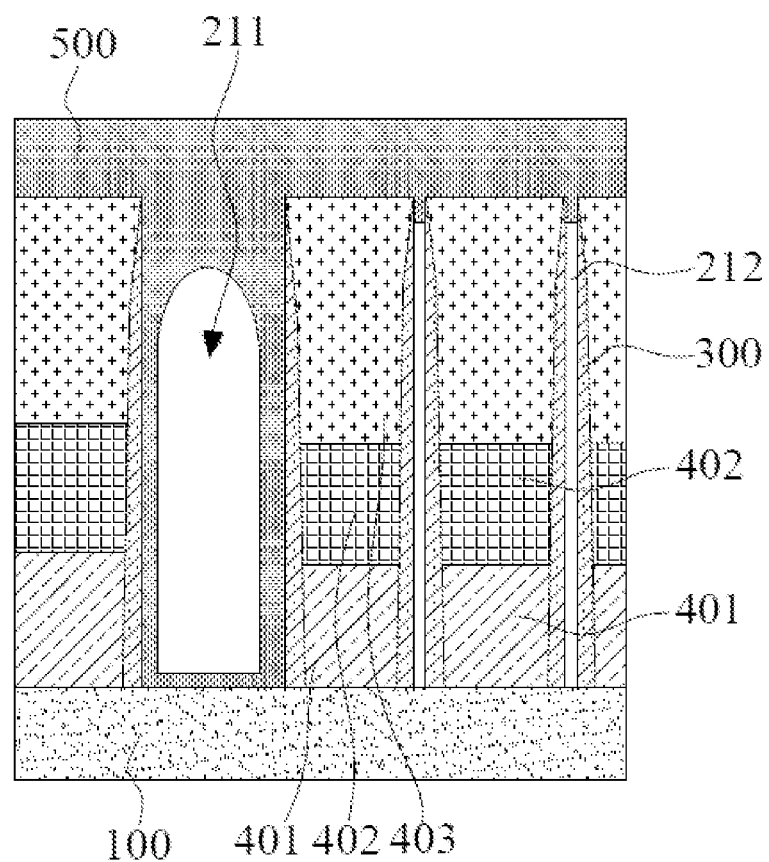
FIG. 15 is a schematic diagram corresponding to a structure after completion of step S160 in FIG. 2.

As shown in FIG. 15, after the passivation layer 403 is formed, the sacrificial layer 200 may be removed by a wet etching process to form the isolation gap. The isolation gap may include a first gap 211 between two adjacent capacitor contact structures 420 in a same column and a second gap 212 between the bitline structure 410 and the capacitor contact structure 420 adjacent thereto.

Figure 16:
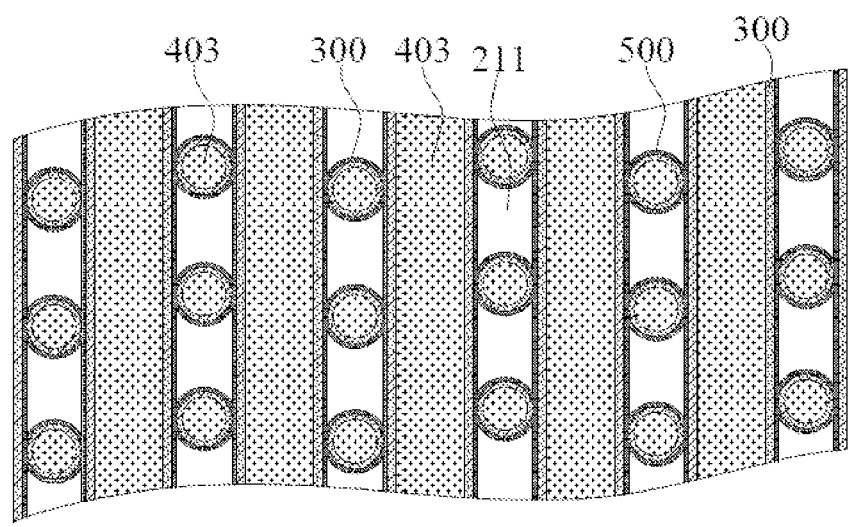
FIG. 16 is a schematic diagram corresponding to the structure in FIG. 15 taken along a direction parallel to a substrate.

For example, wet etching may be performed using an acid solution which may be hydrofluoric acid. For example, it may be buffered hydrofluoric acid (BHF), hydrofluoric acid at a concentration of 49%, or dilute hydrofluoric acid (DHF). In use, a formulation ratio of the acid solution to deionized water may be set according to a specific material of the sacrificial layer 200. A proportion and concentration of the etching solution are not specifically limited herein. By taking the first implementation of the present disclosure as an example, a structure after completion of step S160 is shown in FIG. 15 and FIG. 16.

In step S170, a dielectric layer covering the isolation gap is formed.

As shown in FIG. 9 and FIG. 15, the isolation gap may be filled with a dielectric layer. The dielectric layer may be made of a material with a low dielectric constant, which may effectively reduce parasitic capacitance between the bitline structures 410 and reduce power consumption of the device. For example, it may be a silicon oxide material. In one implementation, the dielectric layer may fill each isolation gap. In another implementation, the second gap 212 may be rapidly sealed during the deposition of the dielectric layer to form an air gap. Since a dielectric constant of the air is less than that of silicon oxide, the formation of the air gap can reduce the parasitic capacitance of the device. For example, a deposition rate of a dielectric layer 500 covering the isolation gap may be controlled to deposit the dielectric layer 500, so as to rapidly seal the second gap 212 and form an air gap. Moreover, in order to prevent cracks between the bitline structures 410 in subsequent packaging and practical application and ensure device stability, a top surface of the air gap should not exceed that of the bitline structure 410.

It is to be noted that the air gap may also be formed in a dielectric layer between two adjacent capacitor contact structures 420 while the second gap 212 is rapidly sealed, so as to further reduce the parasitic capacitance.

A second implementation of the present disclosure provides a semiconductor structure formation method. As shown in FIG. 3, the formation method may include the following steps.

In step S210, a substrate is provided, and a sacrificial layer is formed on the substrate.

Figure 17:
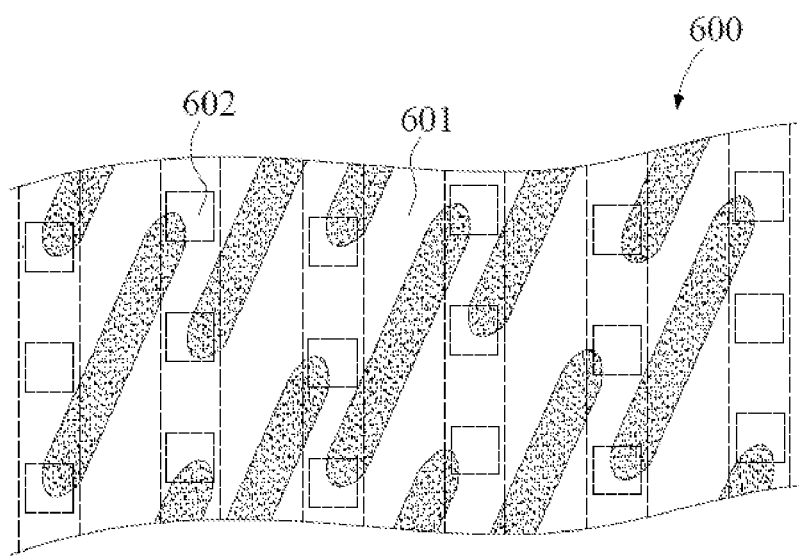
FIG. 17 is a top view of the substrate according to the second implementation of the present disclosure.

As shown in FIG. 17, the substrate 600 may be of a plate structure, and a bitline formation region 601 and a formation region 602 of capacitor contact structures 920 may be predefined on the substrate 600. The substrate 600 may be a rectangular, circular, oval, polygonal or irregular pattern, and may be made of silicon or other semiconductor materials. The shape and material of the substrate 600 are not specially limited.

Figure 18:
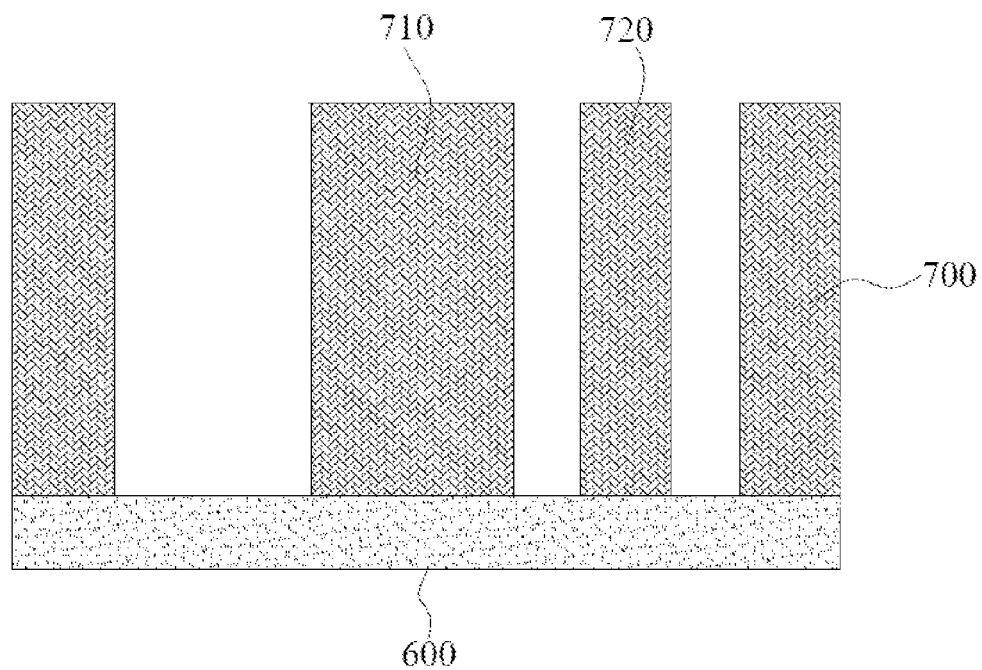
FIG. 18 is a schematic diagram corresponding to a structure after completion of step S220 in FIG. 3.

As shown in FIG. 18, a sacrificial layer 700 may be formed on a surface of the substrate 600. The sacrificial layer 700 may be a film formed on the substrate 600 or a coating formed on substrate 600, and may be made of silicon oxide, which are not specially limited herein. The sacrificial layer 700 may be formed on the substrate 600 by atomic layer deposition, vacuum evaporation, magnetron sputtering, chemical vapor deposition, physical vapor deposition, or the like. Certainly, the sacrificial layer 700 may also be formed on the substrate 600 by using other processes, and a forming process of the sacrificial layer 700 is not specially limited herein.

In step S220, the sacrificial layer is patterned to form first sacrificial structures and second sacrificial structures distributed side by side.

Figure 19:
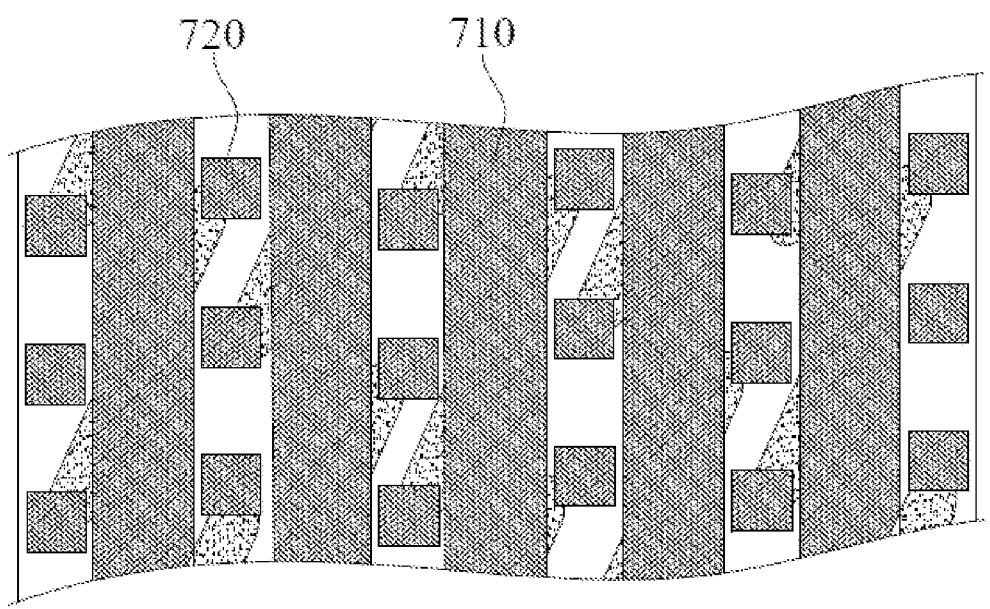
FIG. 19 is a top view corresponding to the structure in FIG. 18.

As shown in FIG. 18 and FIG. 19, the sacrificial layer 700 may be patterned by photolithography according to the predefined bitline formation region 601 and formation region 602 of capacitor contact structures 920, so as to form first sacrificial structures 710 and second sacrificial structures 720 distributed side by side in the sacrificial layer 700. The first sacrificial structure 710 may be strip-like in a direction parallel to the substrate 600, and may extend along the direction parallel to the substrate 600. The second sacrificial structure 720 may be a circular, rectangular or irregular column structure, which is not specially limited herein.

As shown in FIG. 19, a plurality of second sacrificial structures 720 may be provided. The plurality of second sacrificial structures 720 may be arranged in a column and may be spaced along an extension direction of the first sacrificial structure 710. In one implementation, each first sacrificial structure 710 may form a group with each column of second sacrificial structures 720, a plurality of groups of first sacrificial structures 710 and second sacrificial structures 720 distributed side by side may be formed, and columns formed by the first sacrificial structures 710 and the second sacrificial structures 720 in two adjacent groups are alternately distributed. That is, the second sacrificial structures 720 are distributed on two sides of the first sacrificial structure 710 and may be spaced along an extension direction of the first sacrificial structure 710.

For example, a mask material layer may be formed on one side of the sacrificial layer 700 away from the substrate 600 by chemical vapor deposition, vacuum evaporation, atomic layer deposition or other means. The mask material layer may be of a multi-layer or monolayer structure, and may be made of at least one of a polymer, SiO2, SiN, poly and SiCN, and certainly, may also be made of other materials, which are not listed herein.

A photoresist layer may be formed on a surface of the mask material layer facing away from the sacrificial layer 700 by spin coating or other means. The photoresist layer may be made of a positive photoresist or a negative photoresist, which is not specially limited herein.

The photoresist layer may be exposed by using a photomask. A pattern of the photomask may match a pattern required by the sacrificial layer 700. Then, the exposed photoresist layer may be developed to form a plurality of development regions. The mask material layer may be exposed from each development region, and a pattern of the development region may be the same as the pattern required by the sacrificial layer 700. A size of each development region may match a required size of a region other than the first sacrificial structure 710 and the second sacrificial structure 720.

The mask material layer may be etched in the development region by using a plasma etching process. The sacrificial layer 700 may be exposed from an etch region, so as to form a required mask pattern on the mask material layer. After completion of the etching process, the photoresist layer may be removed by cleaning with a cleaning solution or by a process such as ashing, or the like, so that the mask material layer is no longer covered with the photoresist layer, and a formed mask layer is exposed to obtain a hard mask structure.

The sacrificial layer 700 may be isotropically etched according to the mask pattern. For example, the sacrificial layer 700 may be etched in the development region of the mask pattern by a dry etching process, the substrate 600 is used as an etch stop layer, and the first sacrificial structures 710 and the second sacrificial structures 720 distributed side by side are formed in the sacrificial layer 700. FIG. 18 shows a structure after completion of step S220 in the second implementation of the formation method according to the present disclosure.

In step S230, insulating layers covering a sidewall of the first sacrificial structure and a sidewall of the second sacrificial structure are formed.

Figure 20:
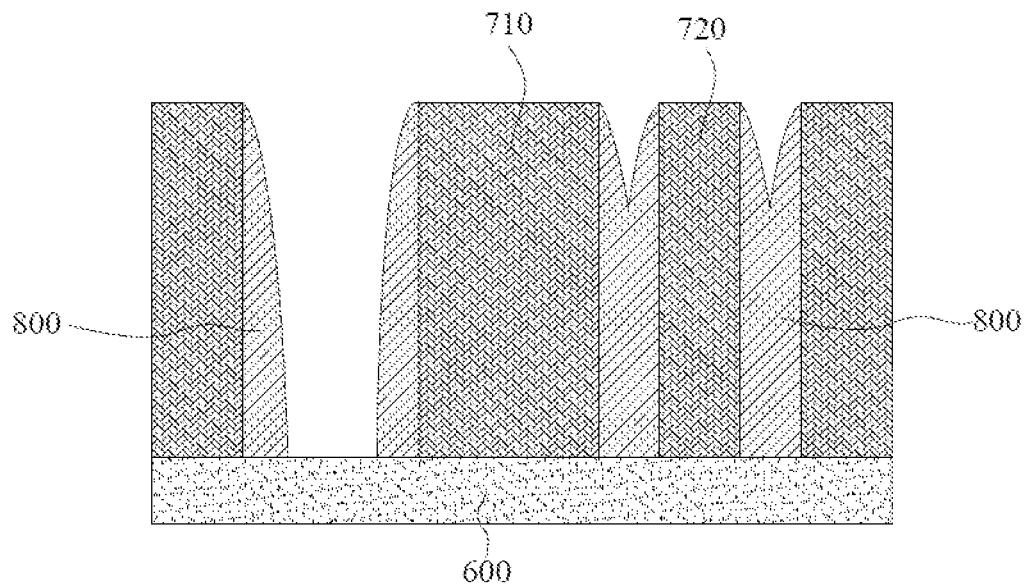
FIG. 20 is a schematic diagram corresponding to a structure after completion of step S230 in FIG. 2.
Figure 21:
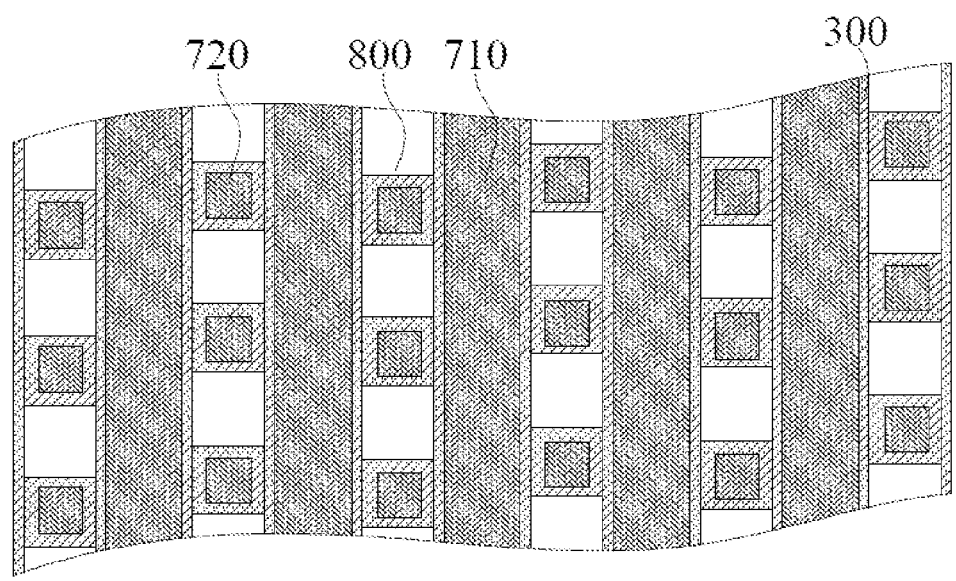
FIG. 21 is a top view corresponding to the structure in FIG. 20.

As shown in FIG. 20 and FIG. 21, conformal insulating layers 800 may be formed on a sidewall of the first sacrificial structure 710 and a sidewall of the second sacrificial structure 720, and the insulating layer 800 located on two sidewalls of the first sacrificial structure 710 may be spread over the two sidewalls of the first sacrificial structure 710. When the first sacrificial structure 710 is strip-like, the insulating layer 800 located on the two sidewalls of the first sacrificial structure 710 may be arranged oppositely. The insulating layer 800 located on the sidewall of the second sacrificial structure 720 may be spread over hole walls of the second sacrificial structure 720. That is, when the second sacrificial structure 720 is a circular column, the insulating layer 800 located on the sidewall of the second sacrificial structure 720 may have a circular cross section in the direction parallel to the substrate 600; when the second sacrificial structure 720 is a rectangular column, the insulating layer 800 located on the sidewall of the second sacrificial structure 720 may have a rectangular cross section in the direction parallel to the substrate 600.

It is to be noted that, the insulating layer 800 located on the sidewall of the first sacrificial structure 710 may be in a contact connection with the insulating layer 800 located on the sidewall of the second sacrificial structure 720; moreover, one side of the insulating layer 800 close to the substrate 600 may be in a contact connection with the substrate 600, and one side thereof facing away from the substrate 600 may be flush with a surface of the sacrificial layer 700 facing away from the substrate 600.

The insulating layer 800 may be a film formed on the sidewall of the second sacrificial structure 720 and the sidewall of the first sacrificial structure 710 or a film layer formed on the sidewall of the second sacrificial structure 720 and the sidewall of the first sacrificial structure 710, which is not specially limited herein. The insulating layer 800 may be formed on the sidewall of the second sacrificial structure 720 and the sidewall of the first sacrificial structure 710 by using a chemical vapor deposition process, and certainly, the insulating layer 800 may also be formed by using other processes, which is not specially limited herein.

It is to be noted that an etching ratio of a material of the sacrificial layer 700 to a material of the insulating layer 800 may be high. For example, the etching ratio of the material of the sacrificial layer 700 to the material of the insulating layer 800 may be greater than 100:1. For example, the insulating layer 800 may be made of Si3N4 or SiCN, and certainly, may also be made of other insulating materials, which are not listed one by one herein.

In one implementation of the present disclosure, an isolation gap may be provided between the first sacrificial structure 710 and the second sacrificial structure 720. The isolation gap may include a first gap 731 between two adjacent capacitor contact structures 920 in a same column and a second gap (not shown in the drawings) between the bitline structure 910 and the capacitor contact structure 920. In one implementation, after the insulating layers 800 covering the sidewall of the first sacrificial structure 710 and the sidewall of the second sacrificial structure 720 are formed, the second gap may be an air gap between the insulating layer 800 located on a sidewall of the bitline structure 910 and the insulating layer 800 located on a sidewall of the capacitor contact structure 920.

Figure 22:
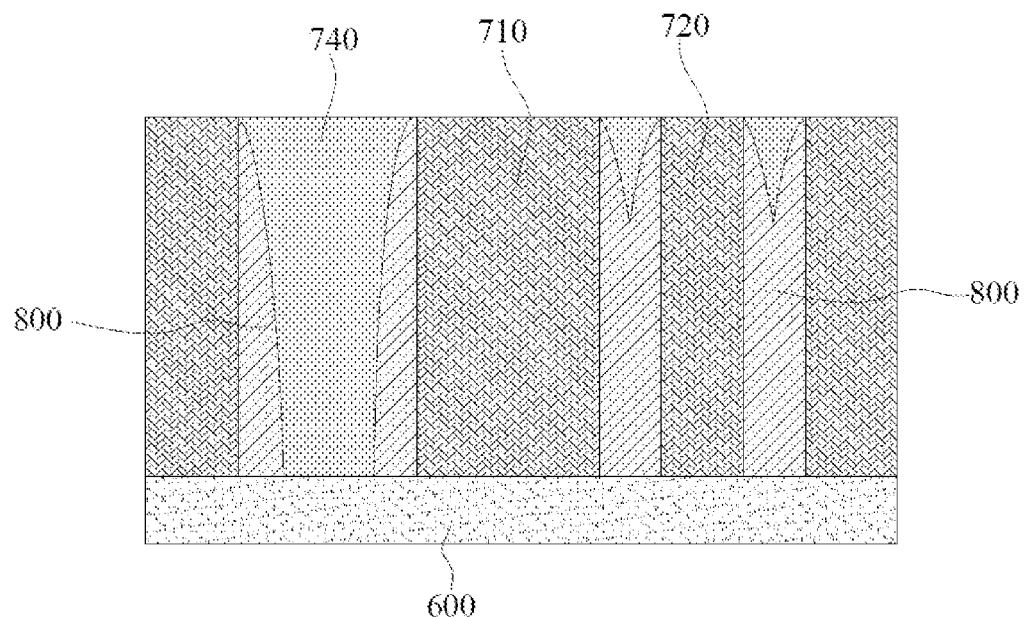
FIG. 22 is a schematic diagram of a filling layer according to the second implementation of the present disclosure.
Figure 23:
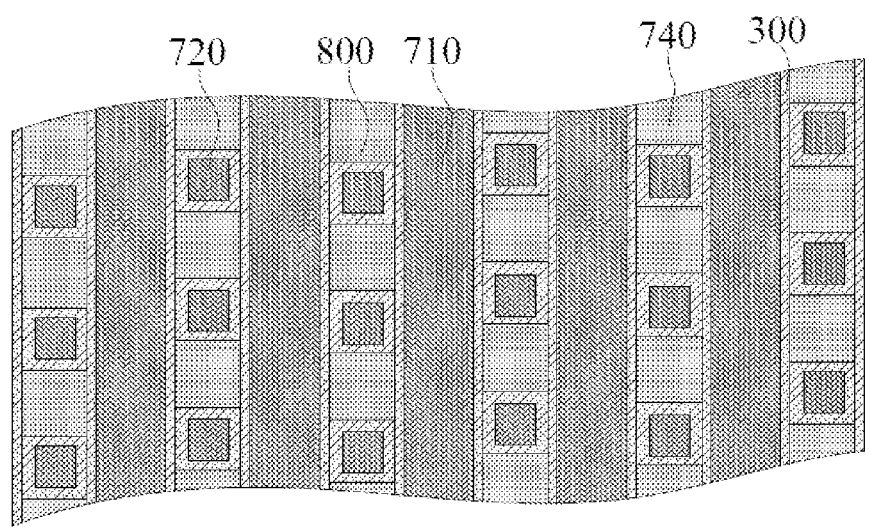
FIG. 23 is a top view corresponding to the structure in FIG. 22.

The formation method according to the present disclosure may further include depositing a filling layer 740 in the isolation gap, as shown in FIG. 22 and FIG. 23. The filling layer 740 may be removed after the bitline structure 910 and the capacitor contact structure 920 are formed, so as to prevent filling of the isolation gap with a conductive material during the formation of the bitline structure 910 and the capacitor contact structure 920. The filling layer 740 may be made of a material with a small density to facilitate subsequent removal. The filling layer 740 may be formed in the isolation gap by chemical vapor deposition or physical vapor deposition. Certainly, the filling layer 740 may also be formed in other manners. The formation manner of the filling layer 740 is not specifically limited herein.

In step S240, the first sacrificial structure is removed to form a trench, and the second sacrificial structure is removed to form a through hole.

Figure 24:
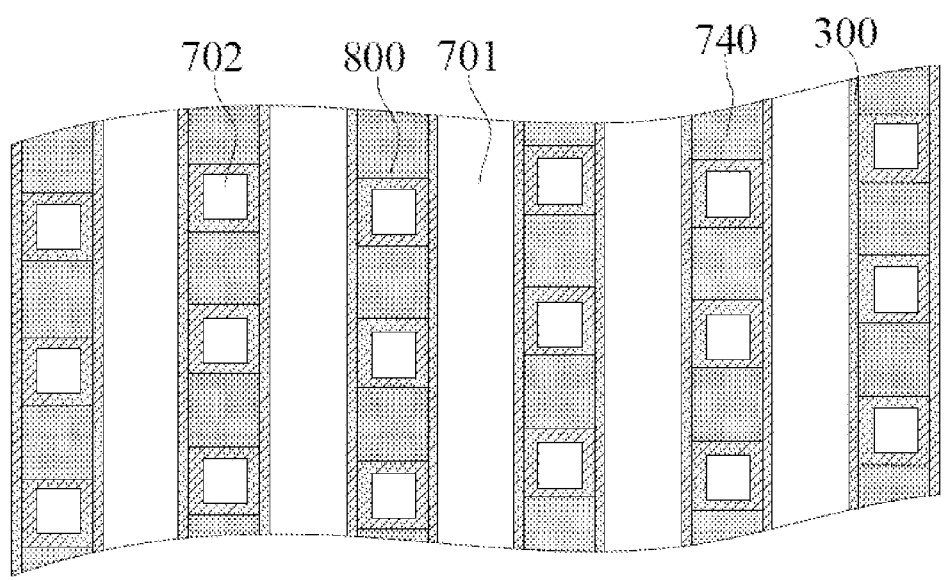
FIG. 24 is a schematic diagram corresponding to a structure after completion of step S240 in FIG. 3.

As shown in FIG. 24, after the insulating layer 800 is formed, by using a wet etching process, the first sacrificial structure 710 may be removed to form a trench 701 and the second sacrificial structure 720 is removed at the same time to form a through hole 702. For example, wet etching may be performed using an acid solution which may be hydrofluoric acid. For example, it may be buffered hydrofluoric acid (BHF), hydrofluoric acid at a concentration of 49%, or dilute hydrofluoric acid (DHF). In use, a formulation ratio of the acid solution to deionized water may be set according to specific materials of the first sacrificial structure 710 and the second sacrificial structure 720. A proportion and concentration of the etching solution are not specifically limited herein. A structure after completion of step S240 is shown in FIG. 24.

In step S250, a conductive layer and a passivation layer are sequentially formed in the trench and the through hole to form a bitline structure in the trench.

Figure 25:
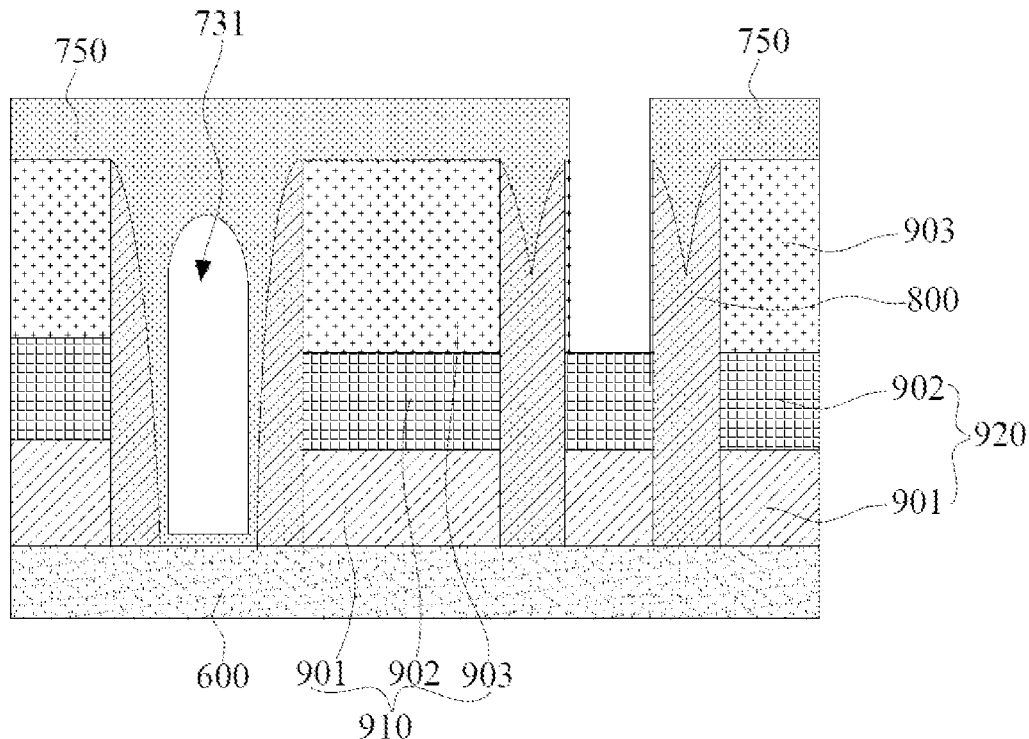
FIG. 25 is a schematic diagram of the semiconductor structure according to the second implementation of the present disclosure.

As shown in FIG. 25, a bitline structure 910 may be formed in the trench 701, the capacitor contact structure 920 is formed in the through hole 702 at the same time, and then the bitline structure 910 may be in a contact connection with a source or drain in the substrate 600 and the capacitor contact structure 920 may be in a contact connection with a capacitor, so as to store charges collected by the capacitor through the capacitor contact structure 920.

It is to be noted that, when a plurality of second contact structures are provided, a plurality of through holes 702 are also provided, and the capacitor contact structure 920 may be formed in each through hole 702. Each capacitor contact structure 920 may have a capacitor corresponding thereto. The charges may be stored simultaneously through a plurality of capacitor contact structures 920, to improve storage capability of a DRAM. When a plurality of first contact structures are provided, a plurality of trenches 701 are also provided, and the bitline structure 910 may be formed in each trench 701, so as to lead out the device electrically.

The conductive layer may be of a monolayer or multi-layer structure, and may be made of a conductor or semiconductor material, which may be, for example, polysilicon, silicon-germanium (SiGe), tungsten, titanium, cobalt, or the like, or compositions thereof, and certainly, may also be other conductive materials. For example, it may also be a metal silicide and compositions of different metal silicides. A number of film layers and the material of the conductive layer are not specially limited herein.

The conductive layer and the passivation layer 903 may be sequentially formed in the trench 701 and the through hole 702 by atomic layer deposition, vacuum evaporation, magnetron sputtering, chemical vapor deposition, physical vapor deposition, or the like. Certainly, the conductive layer and the passivation layer 903 may also be formed in other manners, which are not listed one by one herein.

Figure 26:
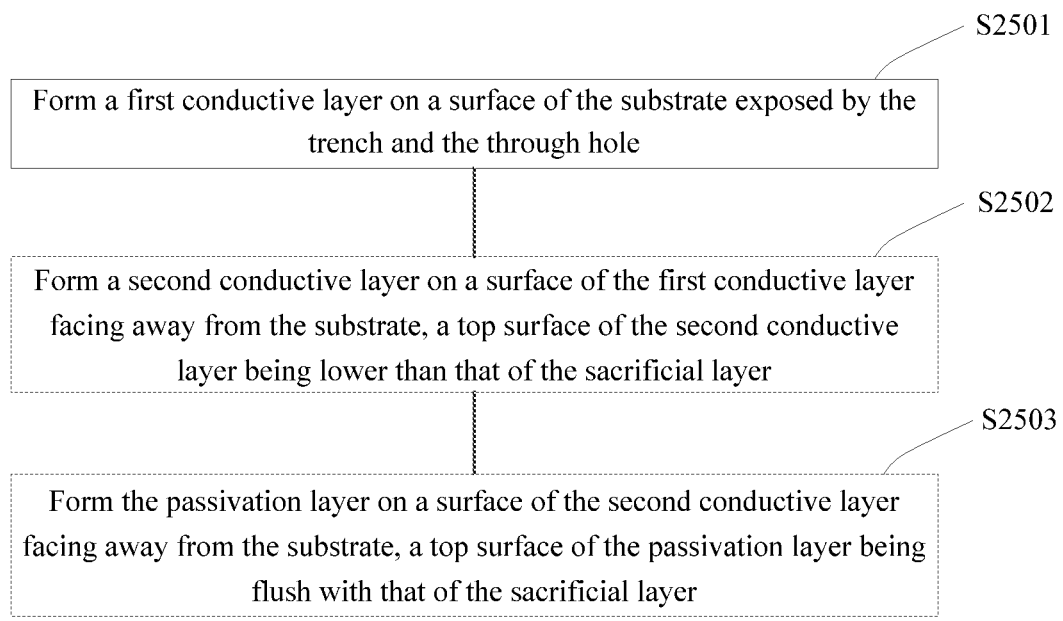
FIG. 26 is a flowchart corresponding to step S250 in FIG. 3.

In one implementation, as shown in FIG. 26, the step of sequentially forming a conductive layer and a passivation layer 903 in the trench 701 and the through hole 702 may include steps S2501 to S2503.

In step S2501, a first conductive layer is formed on a surface of the substrate exposed by the trench and the through hole.

Figure 27:
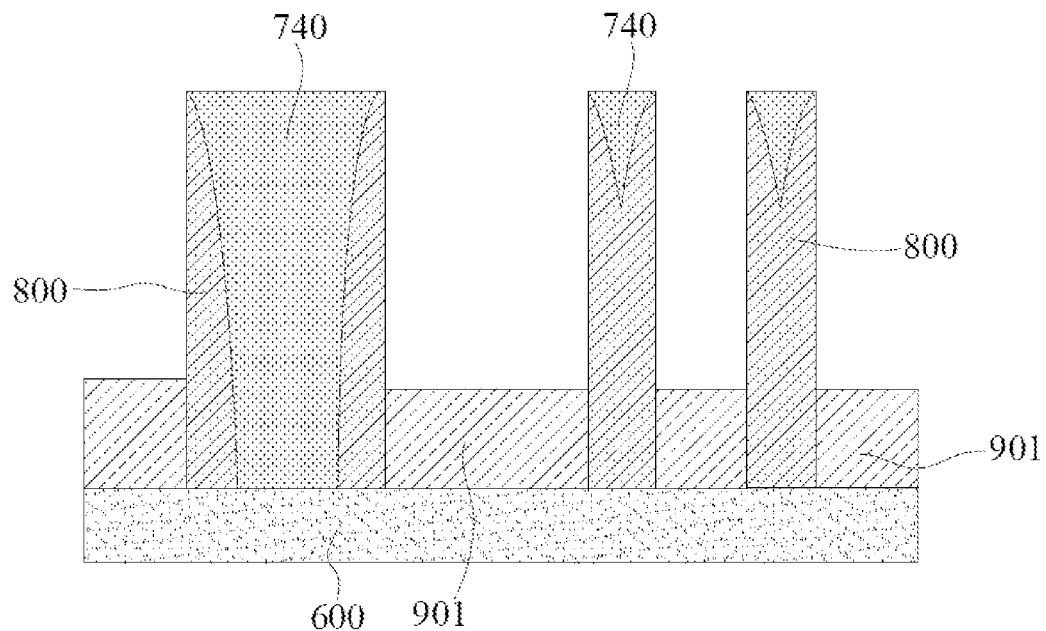
FIG. 27 is a schematic diagram corresponding to a structure after completion of step S2501 in FIG. 26.

As shown in FIG. 27, the first conductive layer 901 may be a film formed on the surface of the substrate 600 and may be made of polysilicon. The first conductive layer 901 may be simultaneously formed, by atomic layer deposition, on the surface of the substrate 600 exposed by the trench 701 and the through hole 702. The first conductive layer 901 may be in a contact connection with the substrate 600, and a surface thereof facing away from the substrate 600 may be lower than one end of the insulating layer 800 facing away from the substrate 600.

In step S2502, a second conductive layer is formed on a surface of the first conductive layer facing away from the substrate, a top surface of the second conductive layer being lower than that of the sacrificial layer.

Figure 28:
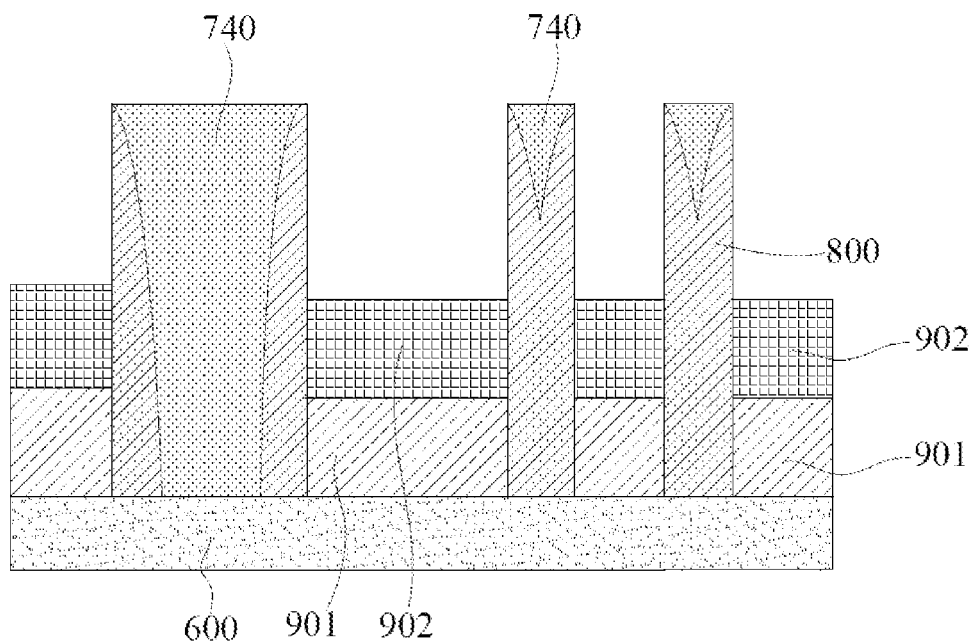
FIG. 28 is a schematic diagram corresponding to a structure after completion of step S2502 in FIG. 26.

As shown in FIG. 28, the second conductive layer 902 may be a film formed on one side of the first conductive layer 901 facing away from the substrate 600 and may be made of tungsten. The second conductive layer 902 may be simultaneously formed, by vacuum evaporation or magnetron sputtering, on the side of the first conductive layer 901 facing away from the substrate 600. The second conductive layer 902 may be in a contact connection with the first conductive layer 901, and a surface thereof facing away from the first conductive layer 901 may be lower than the end of the insulating layer 800 facing away from the substrate 600.

In step S2503, the passivation layer is formed on a surface of the second conductive layer facing away from the substrate, a top surface of the passivation layer being flush with that of the sacrificial layer.

Figure 29:
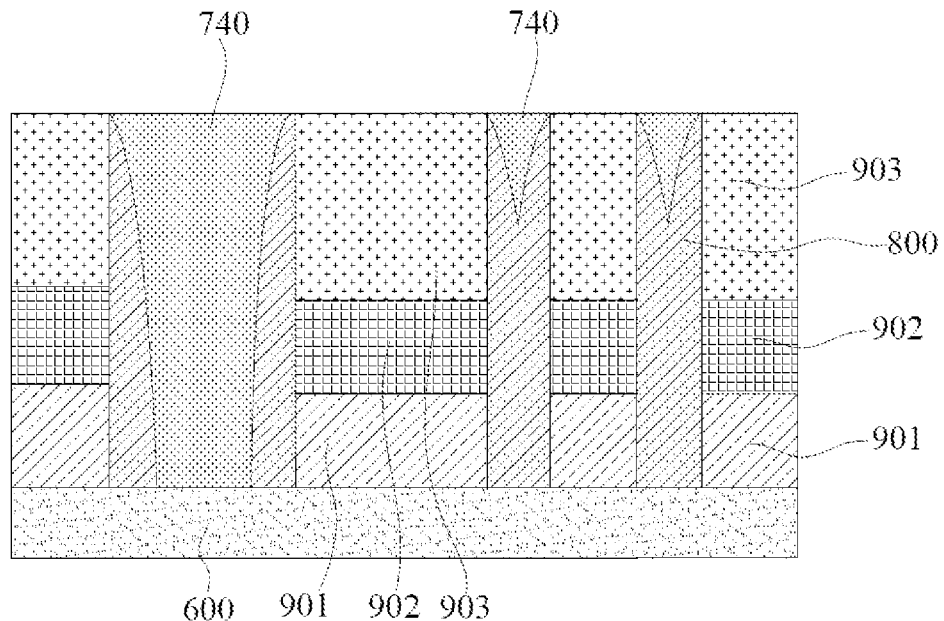
FIG. 29 is a schematic diagram corresponding to a structure after completion of step S2503 in FIG. 26.
Figure 30:
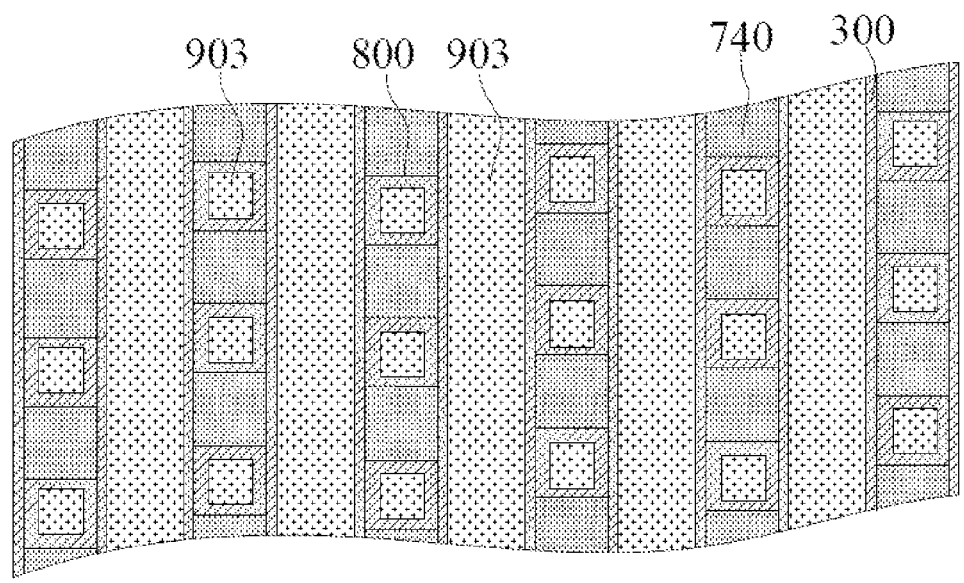
FIG. 30 is a top view corresponding to a structure after completion of step S2503 in FIG. 26.

As shown in FIG. 29 and FIG. 30, the passivation layer 903 may be a film formed on one side of the second conductive layer 902 facing away from the first conductive layer 901, may be configured to protect a surface of the conductive layer, and may be made of silicon nitride. In order to facilitate the process, the passivation layer 903 may be simultaneously formed, by chemical vapor deposition or physical vapor deposition, on the side of the second conductive layer 902 facing away from the first conductive layer 901, and then the bitline structure 910 may be formed in the trench 701. It is to be noted that a surface of the passivation layer 903 facing away from the second conductive layer 902 may be flush with the top surface of the sacrificial layer 700.

In step S260, the passivation layer in the through hole is removed to form a capacitor contact structure.

As shown in FIG. 25, the passivation layer 903 located in the through hole 702 may be removed to form the capacitor contact structure 920 in the through hole 702; that is, the capacitor contact structure 920 may include a conductive layer formed on the substrate 600. For example, the passivation layer 903 located in the through hole 702 may be removed by an anisotropic etching process, to form the capacitor contact structure 920 in each through hole 702.

In one implementation of the present disclosure, subsequent to the step of forming a conductive layer and a passivation layer 903 in the trench 701 and the through hole 702, the formation method according to the present disclosure may further include the following steps.

In step S270, the filling layer is removed to expose the isolation gap.

Figure 31:
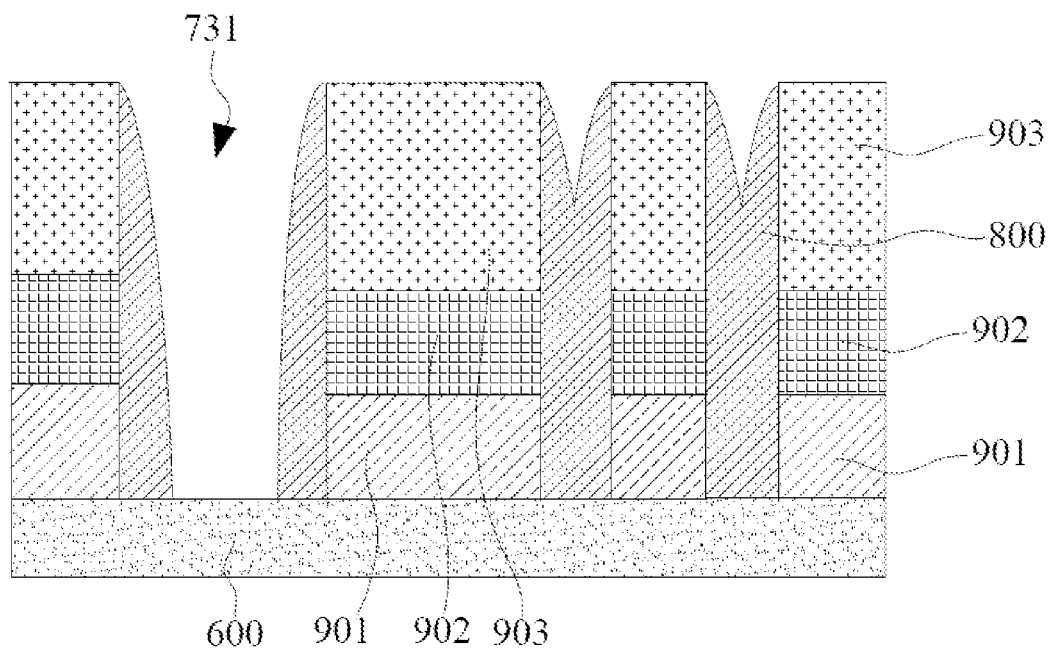
FIG. 31 is a schematic diagram corresponding to a structure after completion of step S270 in FIG. 3.
Figure 32:
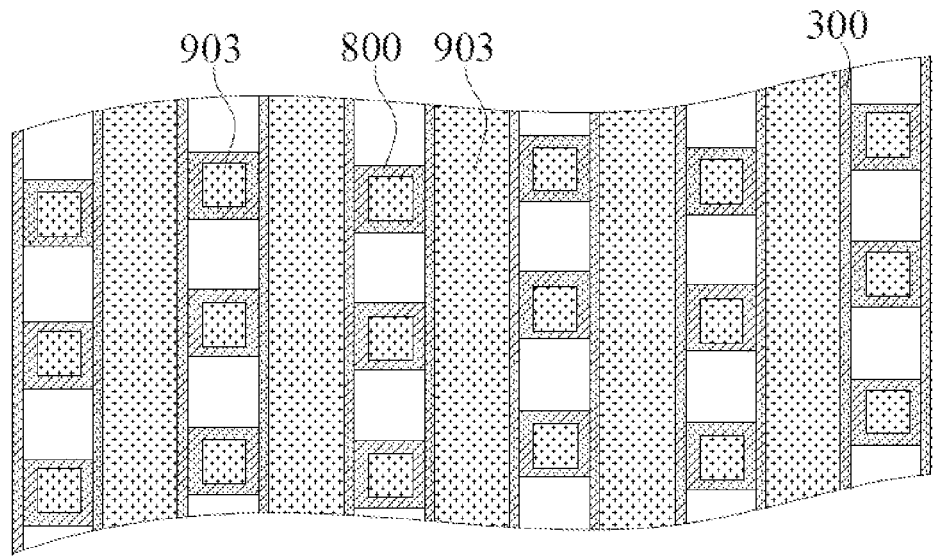
FIG. 32 is a top view corresponding to the structure in FIG. 31.

As shown in FIG. 31 and FIG. 32, the filling layer 740 filling the isolation gap may be removed by using a wet etching process. For example, the filling layer 740 may be removed by acid-etching the filling layer 740 with an acid solution. The acid solution may selectively etch the filling layer 740, which may not cause damages or destructions to other film layer structures.

In step S280, a deposition rate is controlled to form a dielectric layer covering the isolation gap, so as to rapidly seal the second gap and form an air gap, a top surface of the air gap not exceeding that of the bitline structure.

Figure 33:
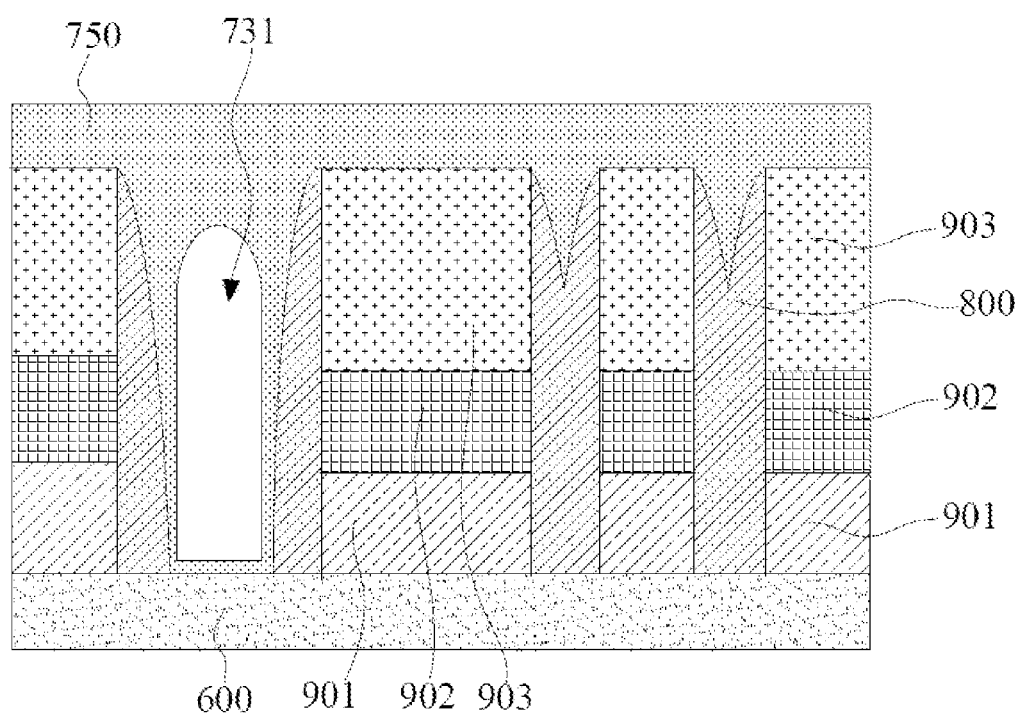
FIG. 33 is a schematic diagram corresponding to a structure after completion of step S280 in FIG. 3.
Figure 34:
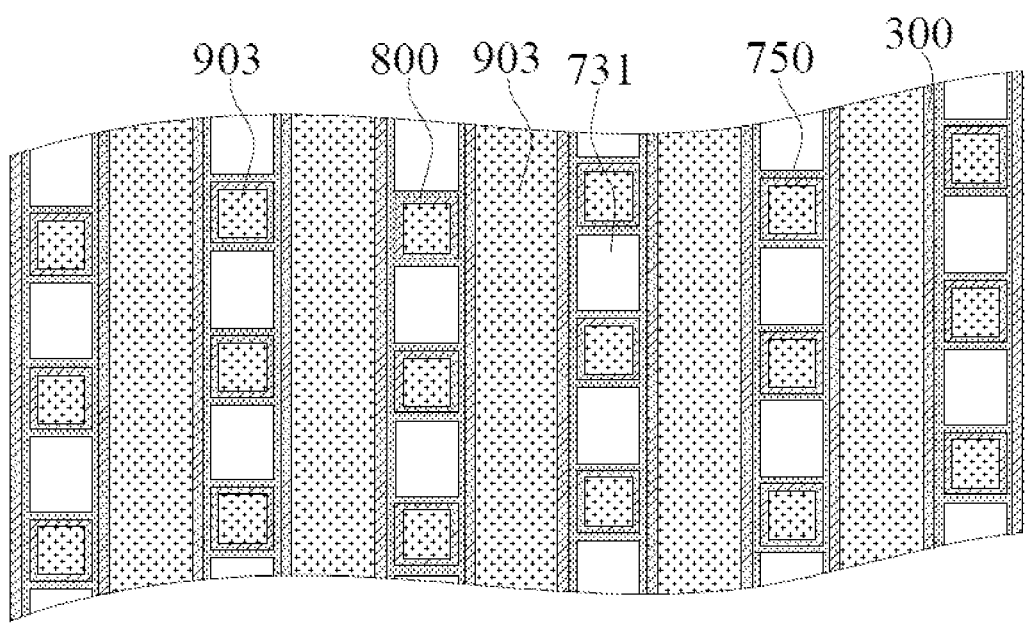
FIG. 34 is a schematic diagram corresponding to the structure in FIG. 33 taken along a direction parallel to a substrate.

As shown in FIG. 33 and FIG. 34, the isolation gap may be filled with a dielectric layer. The dielectric layer may be made of a material with a low dielectric constant, which may effectively reduce parasitic capacitance between the bitline structures 910 and reduce power consumption of the device. For example, it may be a silicon oxide material. In one implementation, the dielectric layer may fill each isolation gap. In another implementation, the second gap may be rapidly sealed during the deposition of the dielectric layer to form an air gap. Since a dielectric constant of the air is less than that of silicon oxide, the formation of the air gap can reduce the parasitic capacitance of the device. For example, a deposition rate of a dielectric layer 750 covering the isolation gap may be controlled to deposit the dielectric layer 750, so as to rapidly seal the second gap and form an air gap. Moreover, in order to prevent cracks between the bitline structures 910 in subsequent packaging and practical application and ensure device stability, a top surface of the air gap should not exceed that of the bitline structure 910.

It is to be noted that the air gap may also be formed in a dielectric layer between two adjacent capacitor contact structures 920 while the second gap is rapidly sealed, so as to further reduce the parasitic capacitance.

An implementation of the present disclosure further provides a semiconductor structure. The semiconductor structure may be formed with the semiconductor structure formation method in any one of the above implementations. The semiconductor structure and beneficial effects may be obtained with reference to the semiconductor structure formation method in any one of the above implementations, which are not described in detail herein.

An implementation of the present disclosure further provides a semiconductor device. The semiconductor device may include the semiconductor structure in any one of the above implementations and a capacitor in a contact connection with the capacitor contact structure 920 in the semiconductor structure. Charges collected in the capacitor may be stored through the capacitor contact structure 920. The semiconductor device and beneficial effects may be obtained with reference to the semiconductor structure formation method in the above implementation, which are not described in detail herein. For example, it may be a Dynamic Random Access Memory (DRAM).

After considering the specification and practicing the invention disclosed herein, those skilled in the art would easily conceive of other implementations of the present disclosure. The present application is intended to cover any variation, use, or adaptive change of the present disclosure. These variations, uses, or adaptive changes follow the general principles of the present disclosure and include common knowledge or common technical means in the art that are not disclosed in the present disclosure. The specification and the embodiments are considered as merely exemplary, and the real scope and spirit of the present disclosure are pointed out in the following claims.

What is claimed is:

1. A semiconductor structure formation method, comprising:
    providing a substrate, and forming a sacrificial layer on the substrate;
    patterning the sacrificial layer to form trenches and through holes distributed side by side in the sacrificial layer, wherein a plurality of the through holes are distributed between adjacent two of trenches, and the plurality of the through holes spaced along an extension direction of the trenches;
    forming insulating layers covering a sidewall of each of the trenches and a sidewall of each of the through holes;
    sequentially forming a conductive layer and a passivation layer in each of the trenches and each of the through holes to form a bitline structure in each of the trenches and a capacitor contact structure in each of the through holes simultaneously, wherein a top surface of the passivation layer being flush with a top surface of the sacrificial layer;
    removing the passivation layer in each of the through holes to form a expose the capacitor contact structure in each of the through holes; and
    forming a capacitor in a contact connection with the capacitor contact structure.

2. The semiconductor structure formation method according to claim 1, wherein portions of the insulating layers covering the sidewall of each of the trenches are separated from portions of the insulating layers covering the sidewall of each of the through holes by the sacrificial layer.

3. The semiconductor structure formation method according to claim 1, wherein the sequentially forming the conductive layer and the passivation layer in each of the trenches and each of the through holes comprises:
    forming a first conductive layer on a surface of the substrate exposed by the trenches and the through holes;
    forming a second conductive layer on a surface of the first conductive layer facing away from the substrate, a top surface of the second conductive layer being lower than the top surface of the sacrificial layer; and
    forming the passivation layer on a surface of the second conductive layer facing away from the substrate.

4. The semiconductor structure formation method according to claim 1, wherein the semiconductor structure formation method further comprises:
    removing the sacrificial layer to form an isolation gap after the passivation layer is formed; and
    forming a dielectric layer covering the isolation gap.

5. The semiconductor structure formation method according to claim 4, wherein the isolation gap comprises a first gap between two adjacent ones of the capacitor contact structures and a second gap between the bitline structure and the capacitor contact structure adjacent to the bitline structure; and forming the dielectric layer covering the isolation gap comprises:
    controlling a deposition rate of the dielectric layer to deposit the dielectric layer covering the isolation gap, so as to seal the second gap and form an air gap, a top surface of the air gap not exceeding a top surface of the bitline structure.

6. The semiconductor structure formation method according to claim 2, wherein the semiconductor structure formation method further comprises:
    removing the sacrificial layer to form an isolation gap after the passivation layer is formed; and
    forming a dielectric layer covering the isolation gap.

7. The semiconductor structure formation method according to claim 3, wherein the semiconductor structure formation method further comprises:
    removing the sacrificial layer to form an isolation gap after the passivation layer is formed; and
    forming a dielectric layer covering the isolation gap.

* * * * *